United States Patent
Chuang et al.

(10) Patent No.: US 11,735,669 B2
(45) Date of Patent: Aug. 22, 2023

(54) VERTICALLY-ORIENTED COMPLEMENTARY TRANSISTOR

(71) Applicant: Taiwan Semiconductor Manufacturing Company, Ltd., Hsinchu (TW)

(72) Inventors: Chi-Yi Chuang, Hsinchu (TW); Hou-Yu Chen, Hsinchu County (TW); Kuan-Lun Cheng, Hsin-Chu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 119 days.

(21) Appl. No.: 17/094,904

(22) Filed: Nov. 11, 2020

(65) Prior Publication Data

US 2022/0037528 A1 Feb. 3, 2022

Related U.S. Application Data

(60) Provisional application No. 63/059,011, filed on Jul. 30, 2020.

(51) Int. Cl.
| | |
|---|---|
| H01L 29/78 | (2006.01) |
| H01L 21/02 | (2006.01) |
| H01L 21/8234 | (2006.01) |
| H01L 29/66 | (2006.01) |

(52) U.S. Cl.
CPC ...... *H01L 29/7851* (2013.01); *H01L 21/0245* (2013.01); *H01L 21/02293* (2013.01); *H01L 21/02532* (2013.01); *H01L 21/823412* (2013.01); *H01L 21/823418* (2013.01); *H01L 21/823431* (2013.01); *H01L 21/823487* (2013.01); *H01L 29/6681* (2013.01); *H01L 29/66818* (2013.01)

(58) Field of Classification Search
CPC ............. H01L 29/7851; H01L 29/6681; H01L 29/66818; H01L 21/02293; H01L 21/0245; H01L 21/02532; H01L 21/823412; H01L 21/823418; H01L 21/823431; H01L 21/823487
See application file for complete search history.

(56) References Cited

U.S. PATENT DOCUMENTS

| | | |
|---|---|---|
| 9,711,501 B1 | 7/2017 | Basker et al. |
| 9,818,872 B2 | 11/2017 | Ching et al. |
| 9,887,269 B2 | 2/2018 | Ching et al. |
| 9,899,398 B1 | 2/2018 | Colinge et al. |
| 10,032,627 B2 | 7/2018 | Lee et al. |

(Continued)

FOREIGN PATENT DOCUMENTS

TW 201923908 A 6/2019

*Primary Examiner* — Christine A Enad
(74) *Attorney, Agent, or Firm* — Haynes and Boone, LLP

(57) ABSTRACT

A semiconductor device according to the present disclosure includes a first transistor and a second transistor disposed over the first transistor. The first transistor includes a plurality of channel members vertically stacked over one another, and a first source/drain feature adjoining the plurality of channel members. The second transistor includes a fin structure, and a second source/drain feature adjoining the fin structure. The semiconductor device further includes a conductive feature electrically connecting the first source/drain feature and the second source/drain feature.

20 Claims, 40 Drawing Sheets

(56) References Cited

U.S. PATENT DOCUMENTS

| | | |
|---|---|---|
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 2018/0175036 A1 | 6/2018 | Ching et al. |
| 2019/0148376 A1 | 5/2019 | Chanemougame et al. |
| 2019/0319095 A1* | 10/2019 | Zhang ............. H01L 21/823878 |
| 2019/0326286 A1 | 10/2019 | Xie et al. |
| 2020/0006330 A1* | 1/2020 | Lilak ................... H01L 29/4966 |
| 2020/0006331 A1* | 1/2020 | Lilak ............... H01L 21/823431 |
| 2020/0006340 A1 | 1/2020 | Lilak et al. |
| 2020/0126987 A1* | 4/2020 | Rubin ................. H01L 29/0847 |
| 2020/0235134 A1 | 7/2020 | Lilak et al. |
| 2020/0295003 A1* | 9/2020 | Dewey ............... H01L 29/7851 |

* cited by examiner

VERTICALLY-ORIENTED COMPLEMENTARY TRANSISTOR

PRIORITY DATA

This application claims priority to U.S. Provisional Patent Application No. 63/059,011, filed on Jul. 30, 2020, entitled "Vertically-Oriented Complementary Transistor", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures.

Complementary metal-oxide-semiconductor field effect transistors (CMOSFET or CFET) has dominated the semiconductor industry due to their high noise immunity and low static power consumption. While existing CFET structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
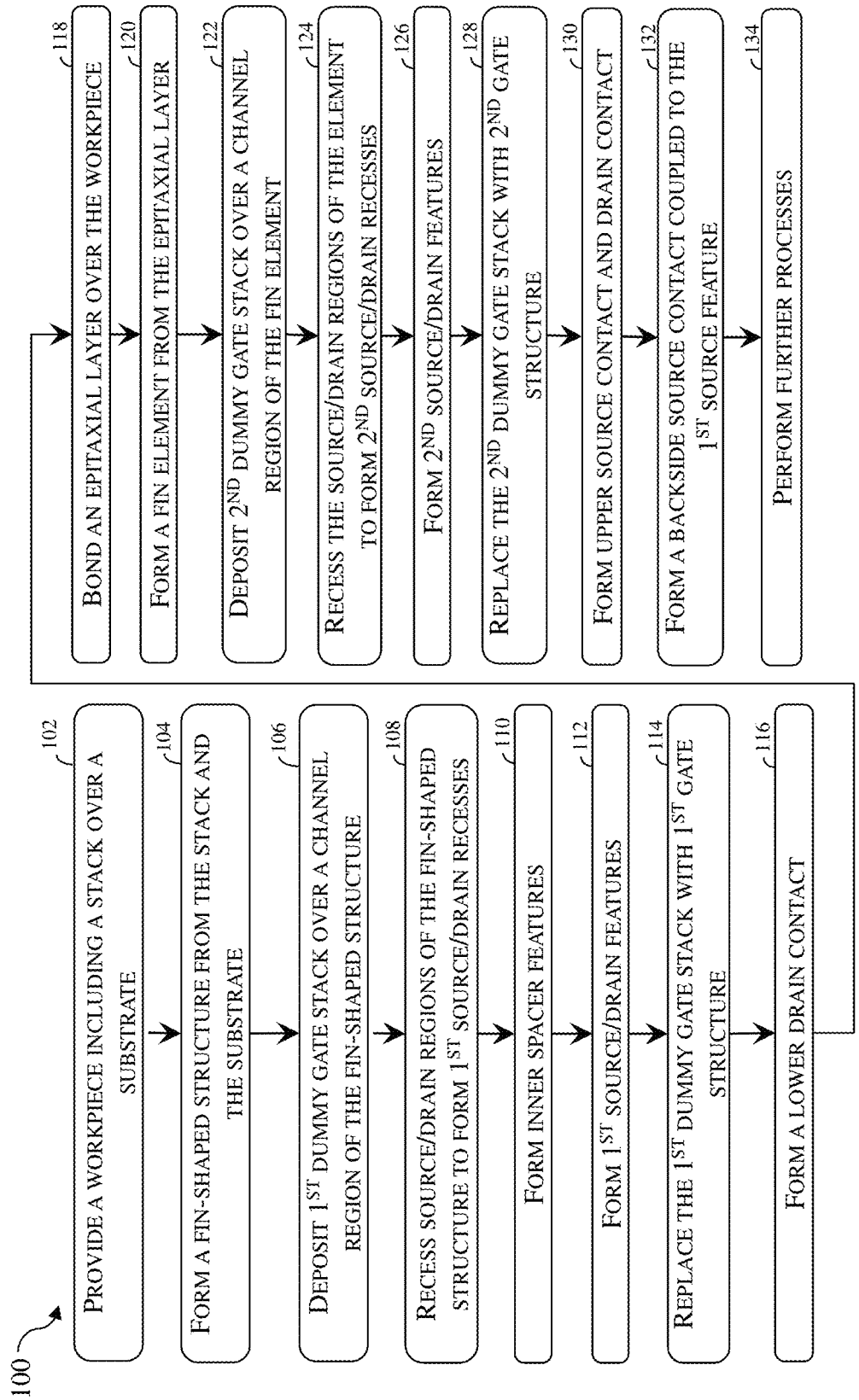
FIG. 1 illustrates a flow chart of a method for forming a semiconductor device having a vertically-oriented complementary transistor, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Complementary metal-oxide-semiconductor field effect transistors (CMOSFET or CFET) has dominated the semiconductor industry due to their high noise immunity and low static power consumption. A conventional CFET includes a n-type FET (NFET) and a p-type FET (PFET) disposed side-by-side on the same substrate and the NFET and PFET share the same structure. For example, in some conventional designs, the NFET and the PFET are both planar devices, both FinFETs, or both MBC transistors. As device dimensions continues to shrink for advance technology nodes, at least two challenges emerge. First, a coplanar CFET has a larger footprint than an NFET or a PFET. Second, hole mobilities in PFETs continue to lag behind electron mobilities in NFETs.

The present disclosure provides processes and structures of vertically-oriented hybrid CFET to address the two challenges identified above. By being vertically-oriented, a CFET according to the present disclosure includes a bottom transistor and a top transistor disposed over the bottom transistor. In some instances, the bottom transistor is a p-type transistor and the top transistor is an n-type transistor. In other instances, the bottom transistor is an n-type transistor and the top transistor is a p-type transistor. By being hybrid, a CFET according to the present disclosure includes p-type FinFET (p-FinFET) and an n-type MBC (n-MBC) transistor. A CFET of the present disclosure therefore includes a p-FinFET as a bottom transistor and an n-MBC transistor as a top transistor, or vice versa. In some embodiments, a source feature and a drain feature of the top transistor are substantially vertical aligned with a source feature and a drain feature of the bottom transistor. This vertical alignment makes it possible to couple a source/drain feature of the bottom device to a source/drain feature of the top device by a conductive feature. In some embodiments, the conductive feature may extend vertically into the source features and the drain features to couple. A backside source contact and a backside power rail may also be integrated with the CFET of the present disclosure.

The various aspects of the present disclosure will now be described in more detail with reference to the figures. In that regard, FIG. 1 is flowcharts illustrating method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100 and some steps described can be replaced, eliminated, or moved around for additional embodiments of the methods. Not all steps are described herein in detail for reasons of simplicity. Method 100 is described below in conjunction with FIGS. 2-39, which are fragmentary cross-sectional views of a workpiece 200 at different stages of fabrication according to embodiments of method 100. For avoidance of doubts, throughout the figures, the X direction is perpendicular to the Y direction and the Z direction is perpendicular to both the X direction and the Y direction. It is noted that, because the workpiece 200 may be fabricated into a semiconductor device, the workpiece 200 may be referred to as the semiconductor device 200 as the context requires. Throughout the present disclosure, similar reference numerals in the present disclosure denote similar features.

Figure 2:
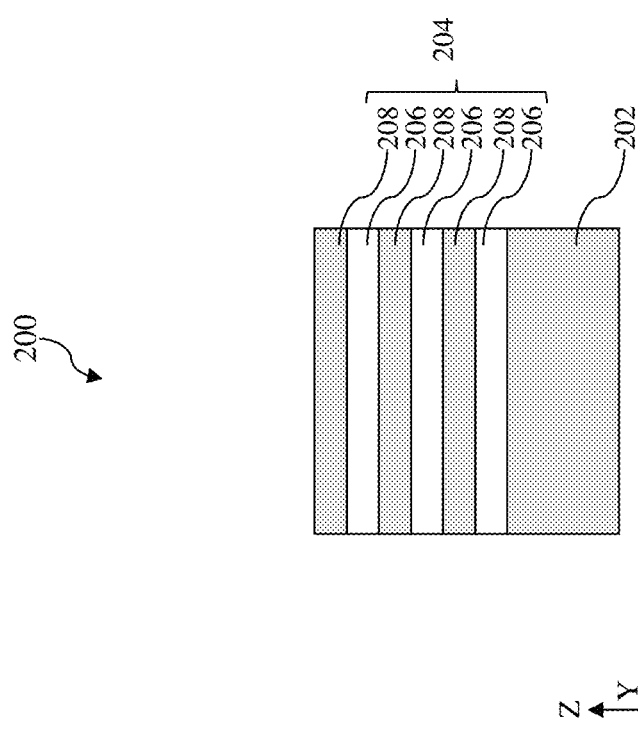
FIGS. 2-39 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is provided. The workpiece 200 may include a first substrate 202. In one embodiment, the first substrate 202 may be a silicon (Si) substrate. In some other embodiments, the first substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs).

As shown in FIG. 2, the workpiece 200 also includes a stack 204 disposed over the substrate 202. The stack 204 includes a plurality of channel layers 208 interleaved by a plurality of sacrificial layers 206. The channel layers 208 and the sacrificial layers 206 may have different semiconductor compositions. In one embodiment, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some alternative embodiments, the channel layers 208 may include germanium (Ge), silicon germanium (SiGe), or a two-dimensional (2D) material such as molybdenum disulfide ($MoS_2$), tungsten diselenide ($WSe_2$), or hafnium ditelluride ($HfTe_2$). In embodiments where the channel layers 208 and the sacrificial layers 206 are formed of silicon germanium (SiGe), the channel layers 208 have a smaller germanium content then the sacrificial layers 206 to allow selective recess/removal of the sacrificial layers 206. In some embodiments, the sacrificial layers 206 and channel layers 208 are epitaxy layers and may be deposited using an epitaxy process. Suitable epitaxy processes include vapor-phase epitaxy (VPE), ultra-high vacuum chemical vapor deposition (UHV-CVD), molecular beam epitaxy (MBE), and/or other suitable processes. As shown in FIG. 2, the sacrificial layers 206 and the channel layers 208 are deposited alternatingly, one-after-another, to form the stack 204. It is noted that three (3) layers of the sacrificial layers 206 and three (3) layers of the channel layers 208 are alternately and vertically arranged as illustrated in FIG. 2, which is for illustrative purposes only and not intended to be limiting beyond what is specifically recited in the claims. It can be appreciated that any number of sacrificial layers 206 and channel layers 208 can be formed in the stack 204. The number of layers depends on the desired number of channels members for the device 200. In some embodiments, the number of the channel layers 208 is between 2 and 10.

Figure 3:
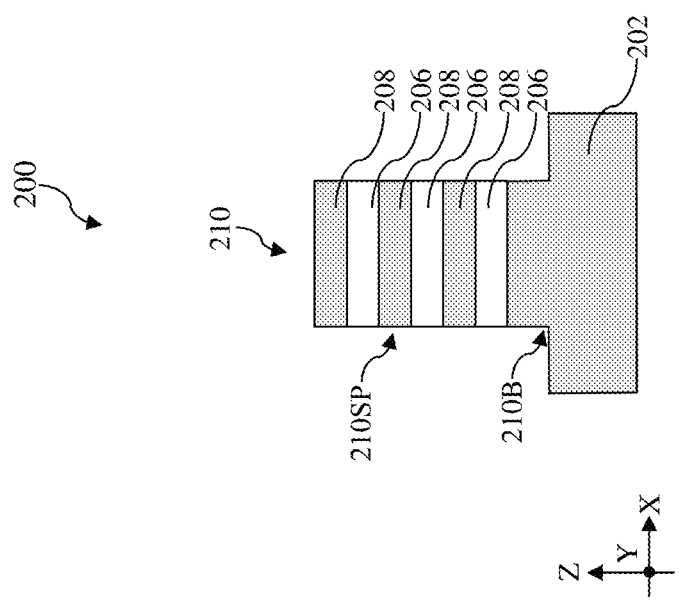

Referring to FIGS. 1 and 3, method 100 includes a block 104 where a fin-shaped structure 210 is formed from the stack 204. In some embodiments, the stack 204 and a portion of the first substrate 202 are patterned to form the fin-shaped structure 210. For patterning purposes, a hard mask layer may be deposited over the stack 204. The hard mask layer may be a single layer or a multilayer. In one example, the hard mask layer includes a silicon oxide layer and a silicon nitride layer over the silicon oxide layer. As shown in FIG. 3, the fin-shaped structure 210 extends vertically along the Z direction from the first substrate 202 and extends lengthwise along the Y direction. The fin-shaped structure 210 may include a base portion 210B formed from the first substrate 202 and a stack portion 210SP formed from the stack 204. The fin-shaped structure 210 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 210 by etching the stack 204 and the first substrate 202. The etching process can include dry etching, wet etching, reactive ion etching (RIE), and/or other suitable processes.

Figure 4:
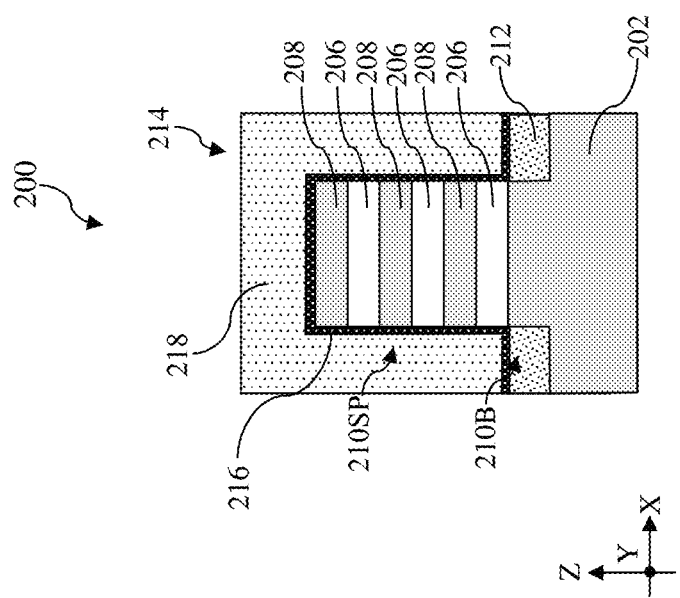
Figure 5:
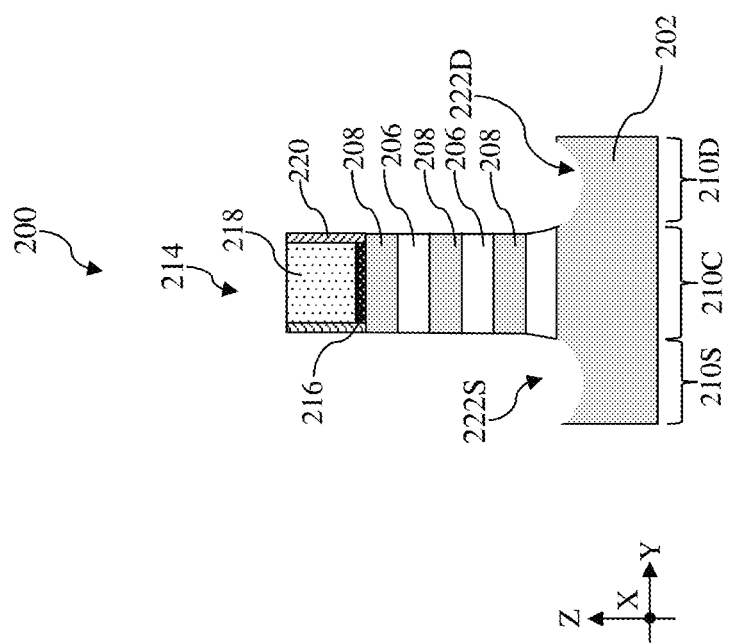

Referring to FIGS. 1, 4 and 5, method 100 includes a block 106 where a first dummy gate stack 214 is formed over a channel region of the fin-shaped structure 210. In some embodiments represented in FIG. 4, after the fin-shaped structure 210 is formed, an isolation feature 212 is formed to surround the base portion 210B. The isolation feature 212 may also be referred to as a shallow trench isolation (STI) feature 212. In an example process, a dielectric material for the isolation feature 212 is deposited over the fin-shaped structure 210 using CVD, sub-atmospheric CVD (SACVD), flowable CVD, atomic layer deposition (ALD), physical vapor deposition (PVD), spin-on coating, and/or other suitable process. Then the deposited dielectric material is planarized and recessed until at least the stack portion 210SP of the fin-shaped structure 210 rises above the isolation feature 212. That is, after the recess of the isolation feature 212, the base portion 210B of the fin-shaped structure 210 is surrounded by the isolation feature 212. The dielectric material for the isolation feature 212 may include silicon oxide, silicon oxynitride, fluorine-doped silicate glass (FSG), a low-k dielectric, combinations thereof, and/or other suitable materials.

In some embodiments where a gate replacement process (or gate-last process) is adopted, the first dummy gate stack 214 is formed over the fin-shaped structure 210 serves as placeholders for a functional gate structure. Other processes and configuration are possible. To form the first dummy gate stack 214, a dummy dielectric layer 216, a dummy gate electrode layer 218, and a gate-top hard mask layer (not shown) are deposited over the workpiece 200. The deposition of these layers may include use of low-pressure CVD (LPCVD), CVD, plasma-enhanced CVD (PECVD), PVD, ALD, thermal oxidation, e-beam evaporation, or other suitable deposition techniques, or combinations thereof. The dummy dielectric layer 216 may include silicon oxide, the dummy gate electrode layer 218 may include polysilicon, and the gate-top hard mask layer may be a multi-layer that includes silicon oxide and silicon nitride. Using photolithography and etching processes, the gate-top hard mask layer is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Thereafter, using the patterned gate-top hard mask as the etch mask, the dummy dielectric layer 216 and the dummy gate electrode layer 218 are then etched to form the first dummy gate stack 214. As shown in FIG. 4, the first dummy gate stack 214 is formed over the isolation feature 212 and a portion of the fin-shaped structure 210. The first dummy gate stack 214 extends lengthwise along the X direction to wrap over the fin-shaped structure 210. Referring to FIG. 5, the portion of the fin-shaped structure 210 underlying the first dummy gate stack 214 is a first channel region 210C. The first channel region 210C and the first dummy gate stack 214 also define a first source region 210S and a first drain region 210D that are not vertically overlapped by the first dummy gate stack 214. The first channel region 210C is disposed or sandwiched between the first source region 210S and the first drain region 210D along the Y direction.

As representatively shown in FIG. 5, operations at block 106 may include formation of a first gate spacer layer 220 over sidewalls of the first dummy gate stack 214. In some embodiments, the formation of the first gate spacer layer 220 includes conformal deposition of one or more dielectric layers over the workpiece 200. In an example process, the one or more dielectric layers are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof.

Referring to FIGS. 1 and 5, method 100 includes a block 108 where the first source region 210S and the first drain region 210D of the fin-shaped structure 210 are recessed to form a first source recess 222S and a first drain recess 222D. In an example process, after the deposition of the first gate spacer layer 220, the workpiece 200 is etched in an etch process that selectively recesses the first source region 210S and the first drain region 210D of the fin-shaped structure 210. The selective recess of the first source region 210S and the first drain region 210D results in the first source recess 222S and the first drain recess 222D. The etch process at block 108 may be a dry etch process or a suitable etch process. An example dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 5, sidewalls of the sacrificial layers 206 and the channel layers 208 in the first channel region 210C are exposed in the first source recess 222S and the first drain recess 222D.

Figure 6:
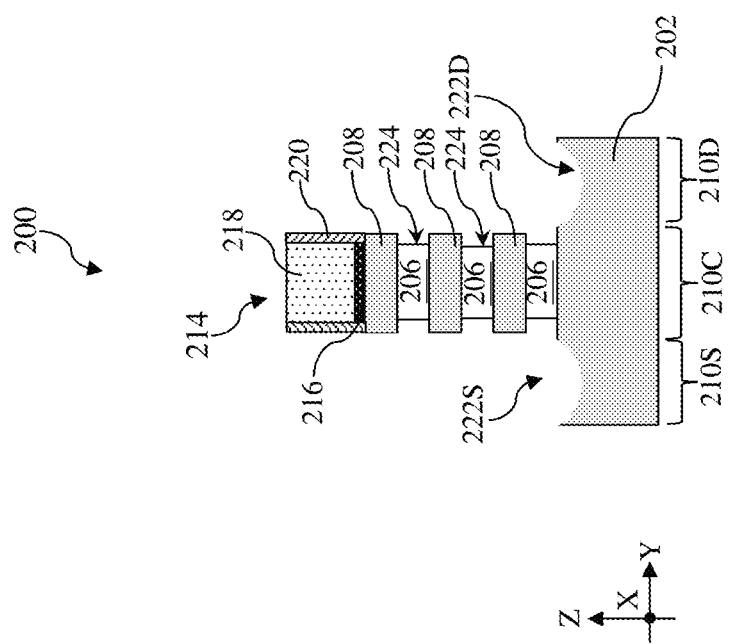
Figure 7:
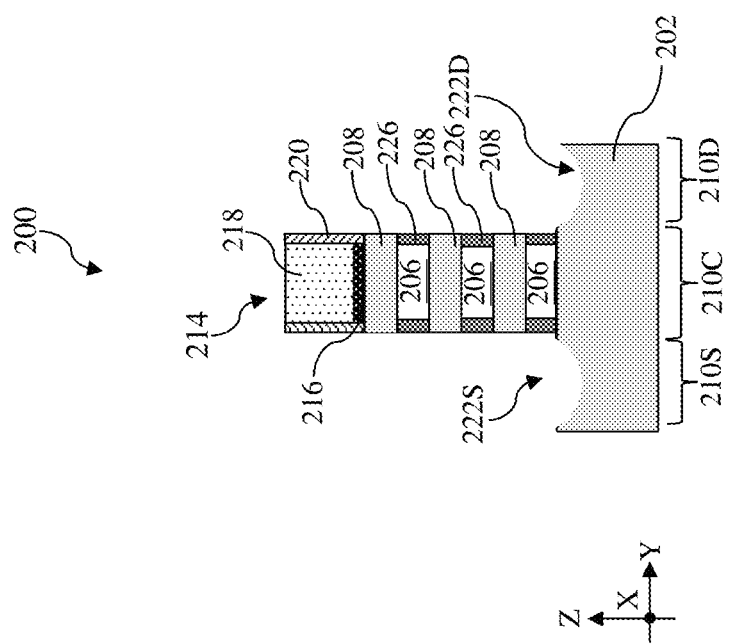

Referring to FIGS. 1, 6 and 7, method 100 includes a block 110 where inner spacer features 226 are formed. Reference is first made to FIG. 6. At block 110, the sacrificial layers 206 exposed in the first source recess 222S and the first drain recess 222D are selectively and partially recessed to form inner spacer recesses 224, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone ($O_3$). In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include an APM etch (e.g., ammonia hydroxide-hydrogen peroxide-water mixture).

Reference is now made to FIG. 7. After the formation of the inner spacer recesses 224, an inner spacer material layer is deposited over the workpiece 200, including in the inner spacer recesses 224. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over the first gate spacer layer 220 and sidewalls of the channel layers 208, thereby forming the inner spacer features 226 as shown in FIG. 7. In some embodiments, the etch back process at block 110 may be a dry etch process that includes use of an oxygen-containing gas, hydrogen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof.

Figure 8:
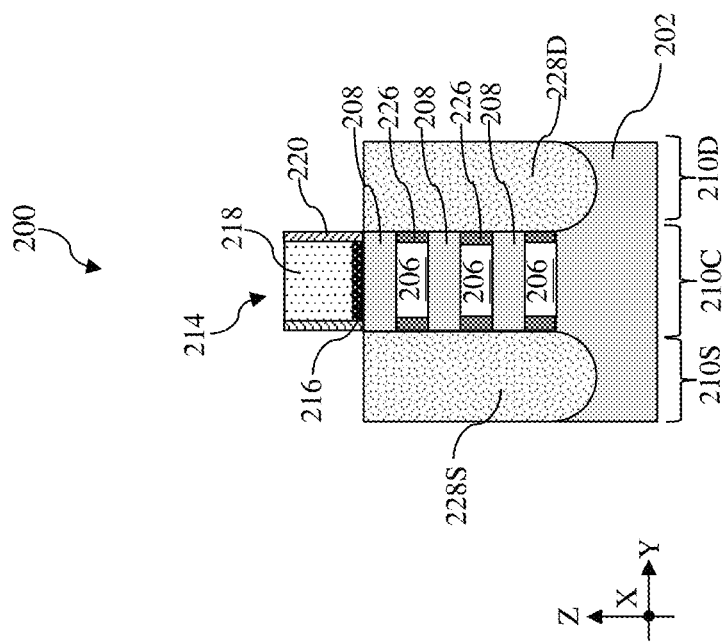

Referring to FIGS. 1 and 8, method 100 include a block 112 where a first source feature 228S and a first drain feature 228D are formed in the first source recess 222S and the first drain recess 222D. In some embodiments, the first source feature 228S and the first drain feature 228D may be formed using an epitaxial process, such as VPE, UHV-CVD, MBE, and/or other suitable processes. The epitaxial growth process may use gaseous and/or liquid precursors, which interact with the composition of the substrate 202 as well as the channel layers 208. The first source feature 228S and the first drain feature 228D are therefore coupled to the channel layers. In some embodiments, the first source feature 228S and the first drain feature 228D may be n-type source/drain features. Example n-type source/drain features may include Si, GaAs, GaAsP, SiP, or other suitable material and may be in-situ doped during the epitaxial process by introducing an n-type dopant, such as phosphorus (P), arsenic (As), or ex-situ doped using an implantation process (i.e., a junction implant process). In one embodiment, the first source feature 228S and the first drain feature 228D include phosphorus-doped silicon (Si:P).

Figure 9:
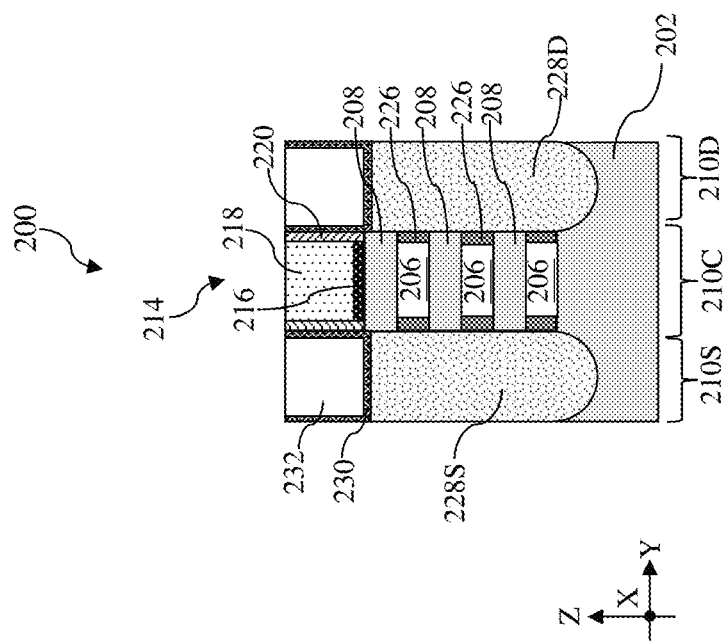

Referring to FIGS. 1, 9, 10 and 11, method 100 include a block 114 where the first dummy gate stack 214 is replaced with a first gate structure 240. Operations at block 114 include deposition of a first contact etch stop layer (CESL) 230 (shown in FIG. 9), deposition of a first interlayer dielectric (ILD) layer 232 (shown in FIG. 9), removal of the first dummy gate stack 214 (shown in FIG. 10), selective removal of the sacrificial layers 206 to release channel layers 208 as channel members 2080 (shown in FIG. 10), formation of the first gate structure 240 (shown in FIG. 10), and a planarization of the workpiece 200 to remove excess materials. The first CESL 230 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 9, the first CESL 230 may be deposited on top surfaces of the first source feature 228S and the first drain feature 228D. Thereafter, the first ILD layer 232 is deposited over the first CESL 230. The first ILD layer 232 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first ILD layer 232 may be deposited by a PECVD process or other suitable deposition technique. In some embodiments, after formation of the first ILD layer 232, the workpiece 200 may be annealed to improve integrity of the first ILD layer 232. To remove excess materials and to expose top surfaces of the first dummy gate stack 214, a planarization process, such a chemical mechanical polishing (CMP) process may be performed.

In some implementations, each of the channel members 2080 has a width (along the X direction) greater than its thickness (along the Z direction) and may be referred to as a nanosheet. In some embodiments, the width of a channel member 2080 may be between about 8 nm and about 60 nm and the thickness of a channel member 2080 may be between about 3 nm and about 9 nm. With respect to each channel member 2080, the primary surfaces are the top surface and the bottom surface. When the first substrate 202 is formed of silicon and has a top surface on the (100) surface, the primary surfaces of the channel members 2080 are also on the (100) surface, which provide superior electron mobility to other surfaces.

Figure 10:
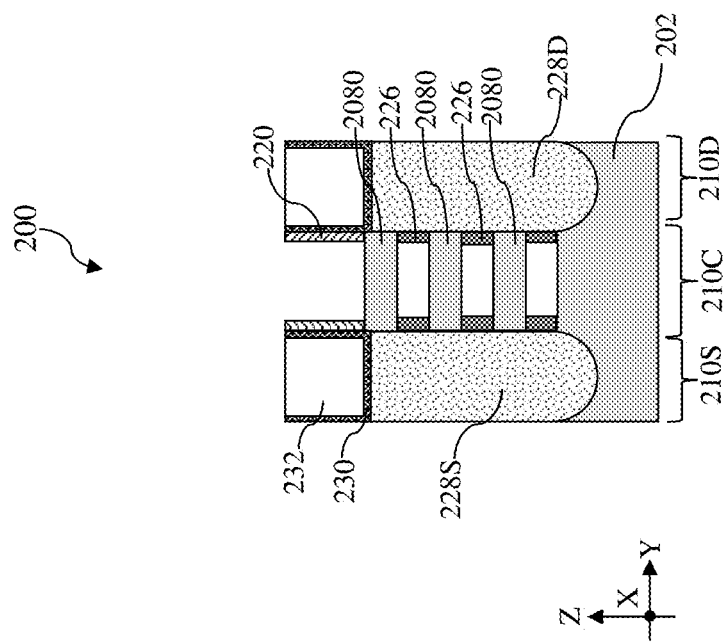

Reference is made to FIG. 10. With the exposure of the first dummy gate stack 214, block 114 proceeds to removal of the first dummy gate stack 214. The removal of the first dummy gate stack 214 may include one or more etching processes that are selective to the material in the first dummy gate stack 214. For example, the removal of the first dummy gate stack 214 may be performed using as a selective wet etch, a selective dry etch, or a combination thereof. After the removal of the first dummy gate stack 214, sidewalls of the channel layers 208 and sacrificial layers 206 in the first channel region 210C are exposed. Thereafter, the sacrificial layers 206 in the first channel region 210C are selectively removed to release the channel layers 208 as the channel members 2080. Here, because the dimensions of the channel members 2080 are nanoscale, the channel members may also be referred to as nanostructures. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a silicon germanium oxide removal. For example, the oxidation may be provided by ozone clean and then silicon germanium oxide removed by an etchant such as $NH_4OH$.

Figure 11:
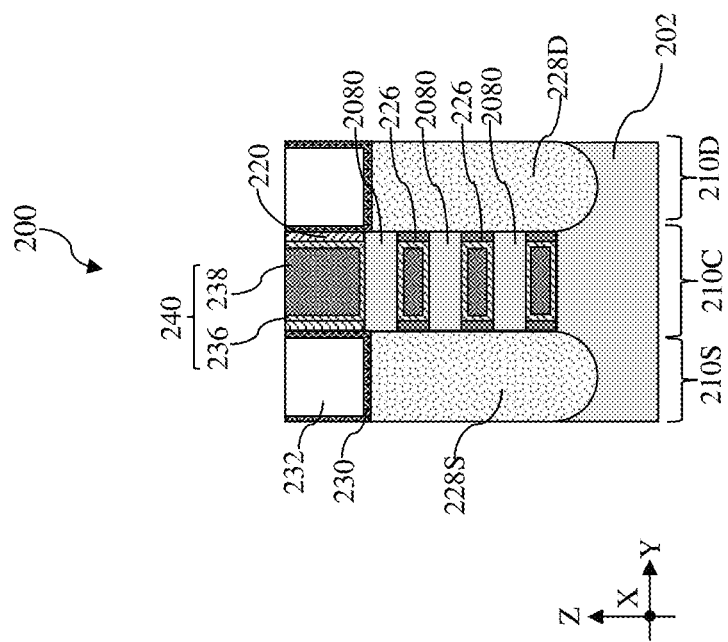

Reference is then made to FIG. 11. With the channel members 2080 released, the first gate structure 240 is deposited to wrap around each of the channel members 2080 in the first channel region 210C. The first gate structure 240 includes a first gate dielectric layer 236 and a first gate electrode layer 238. The first gate dielectric layer 236 may include an interfacial layer and a high-k dielectric layer. Here, a high-k dielectric layer refers to a layer formed of a dielectric material having a dielectric constant greater than that of silicon dioxide, which is about 3.9. In some embodiments, the interfacial layer includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). The high-k dielectric layer is then deposited over the interfacial layer using ALD, CVD, and/or other suitable methods. The high-k dielectric layer may include hafnium oxide. Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material.

Referring still to FIG. 11, the first gate electrode layer 238 is then deposited over the first gate dielectric layer 236 using ALD, PVD, CVD, e-beam evaporation, or other suitable methods. The first gate electrode layer 238 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the first gate electrode layer 238 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

Figure 12:
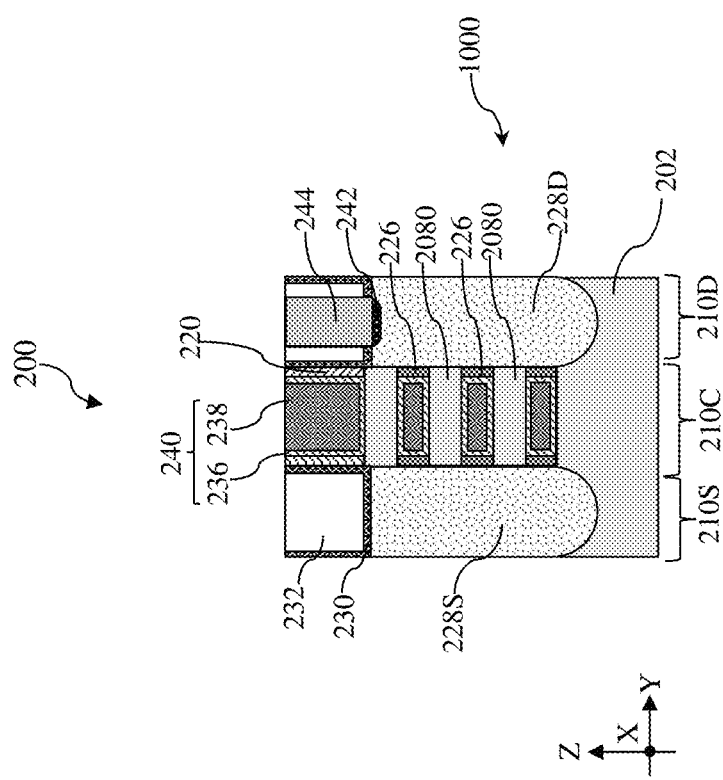
Figure 13:
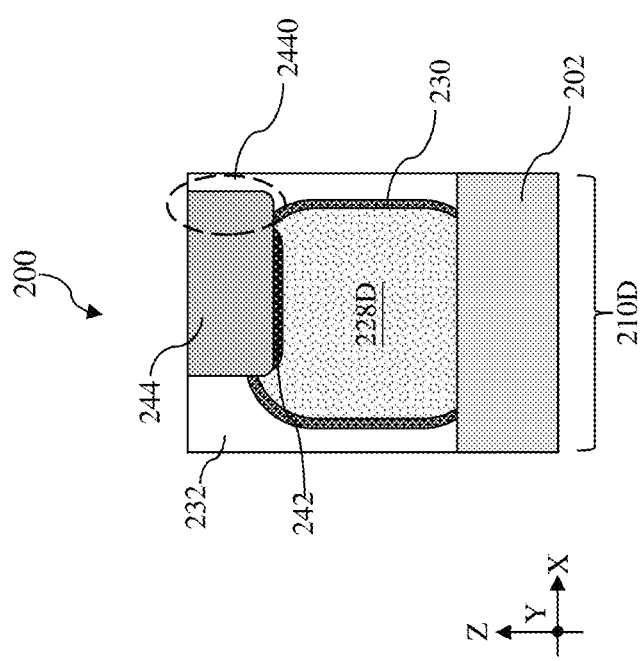

Referring to FIGS. 1, 12 and 13, method 100 includes a block 116 where a lower drain contact 244 is formed. In an example process shown in FIG. 12, lithography processes are used to form a contact opening that exposes the first drain feature 228D. To reduce contact resistance, a silicide layer 242 may be formed on the first drain feature 228D by depositing a metal layer over the first drain feature 228D and performing an anneal process to bring about silicidation between the metal layer and the first drain feature 228D. Suitable metal layer may include titanium (Ti), tantalum (Ta), nickel (Ni), cobalt (Co), or tungsten (W). The silicide layer 242 may include titanium silicide (TiSi), titanium silicon nitride (TiSiN), tantalum silicide (TaSi), tungsten silicide (WSi), cobalt silicide (CoSi), or nickel silicide (NiSi). After the formation of the silicide layer 242, a metal fill layer may be deposited into the contact opening. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). A planarization process may follow to remove excess materials, thereby forming the lower drain contact 244. Due to the planarization process, top surfaces of the lower drain contact 244, the first CESL 230, and the first ILD layer 232 are coplanar.

In some embodiments represented in FIG. 13, the lower drain contact 244 overhangs the first drain feature 228D along the X direction. In these embodiments, the lower drain contact 244 include a first overhang portion 2440 that overhangs the first drain feature 228D by about 2 nm and about 20 nm. That is, the first overhang portion 2440 is not disposed on the first drain feature 228D, either directly or indirectly by way of the silicide layer 242.

Operations at block 116 are optional and may be entirely omitted. As will be described below, in some embodiments where a conductive feature extends into the first drain feature 228D to couple the first drain feature 228D to another drain feature above, the lower drain contact 244 may not be needed and may be omitted.

Figure 14:
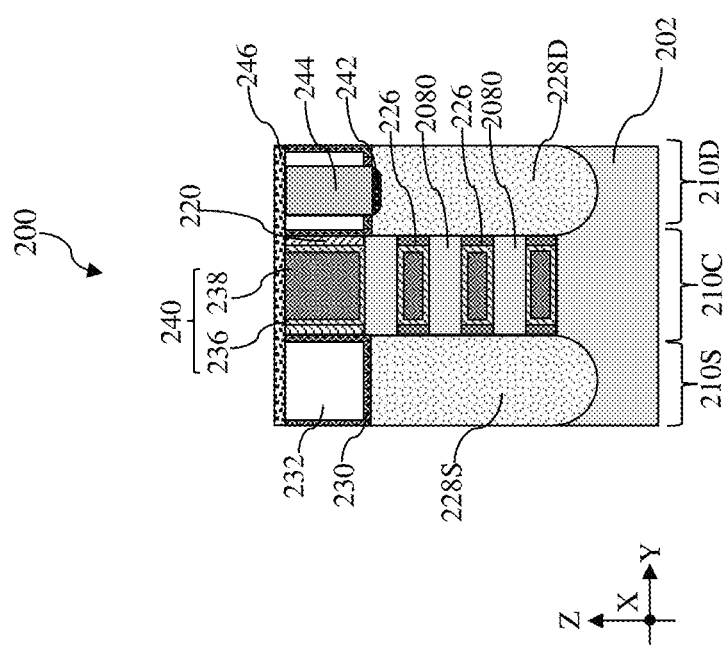
Figure 15:
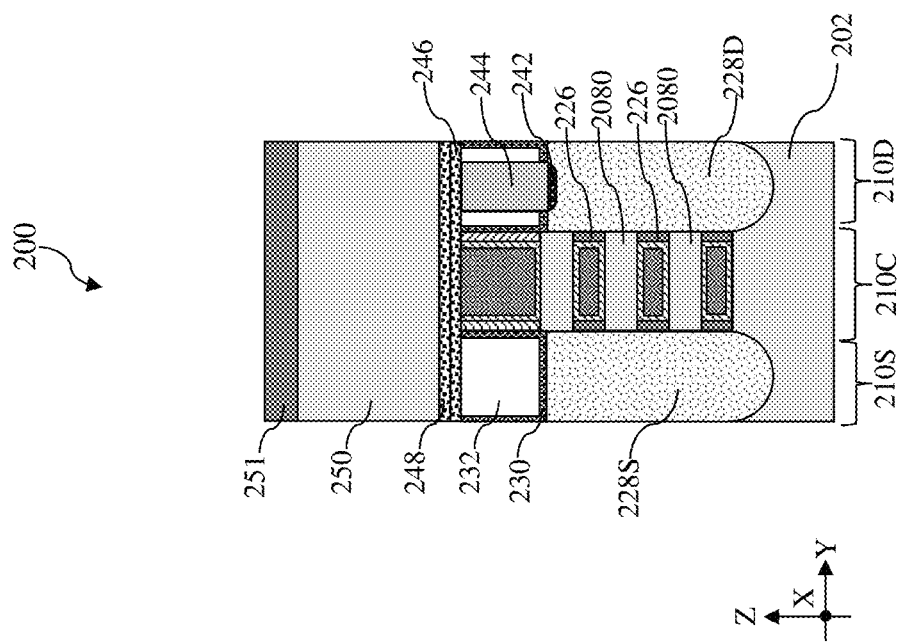

Referring to FIGS. 1, 14 and 15, method 100 includes a block 118 where an epitaxial layer 250 are bonded over to the workpiece 200. Operations at block 118 include deposition of a first passivation layer 246 over the first gate structure 240 (shown in FIG. 14), provision of the epitaxial layer 250 on a second substrate 251 (shown in FIG. 15), deposition of a second passivation layer 248 over the epitaxial layer 250 (shown in FIG. 15), and bonding the second passivation layer 248 to the first passivation layer 246 (shown in FIG. 15). Referring to FIG. 14, at block 118, the first passivation layer 246 is blanketly deposited over the workpiece 200. In one embodiment, the first passivation layer 246 includes silicon oxide. In some alternative embodiments, the first passivation layer 246 may include silicon nitride, silicon carbonitride, silicon oxycarbonitride, aluminum oxide, or hafnium oxide. As shown in FIG. 14, the first passivation layer 246 may be disposed on the first CESL 230, the first ILD layer 232, the first gate structure 240, and the first gate spacer layer 220. Referring to FIG. 15, the second substrate 251 may be similar to the first substrate 202 and detailed description thereof is omitted for brevity. In one embodiment, both the first substrate 202 and the second substrate 251 are silicon substrates with top surfaces on the (100) crystal surface. The epitaxial layer 250 is epitaxially deposited on the second substrate 251 using vapor-phase epitaxy (VPE), ultra-high vacuum chemical vapor deposition (UHV-CVD), molecular beam epitaxy (MBE), and/or other suitable processes. The epitaxial layer 250 is formed of a semiconductor material suitable to serve as channels of p-type devices. In one embodiment, the epitaxial layer 250 may include silicon germanium (SiGe) with a germanium content between about 15% and about 60%. In some alternative embodiments, the epitaxial layer 250 may include germanium (Ge), silicon germanium (SiGe), or a two-dimensional (2D) material such as molybdenum disulfide ($MoS_2$), tungsten diselenide ($WSe_2$), or hafnium ditelluride ($HfTe_2$). The second passivation layer 248 is then deposited on the epitaxial layer 250. In one embodiment, the second passivation layer 248 includes silicon oxide. In some alternative embodiments, the second passivation layer 248 may include silicon nitride, silicon carbonitride, silicon oxycarbonitride, aluminum oxide, or hafnium oxide.

The epitaxial layer 250 is bonded to the workpiece 200 by direct bonding or fusion bonding between the first passivation layer 246 and the second passivation layer 248. In an example direct bonding process, both the first passivation layer 246 and the second passivation layer 248 are cleaned using RCA SC-1 (ammonia, hydrogen peroxide and water) and/or RCA SC-2 (hydrochloric acid, hydrogen peroxide and water). The cleaned first passivation layer 246 and second passivation layer 248 are then mated and pressed together at room temperature. The direct bonding may be strengthened by an anneal process. Although not explicitly shown in FIG. 15, after the first passivation layer 246 and the second passivation layer 248 are bonded together, the second substrate 251 is removed to expose the epitaxial layer 250 on the top surface. At this point, the epitaxial layer 250 and the second passivation layer 248 become part of the workpiece 200.

Figure 16:
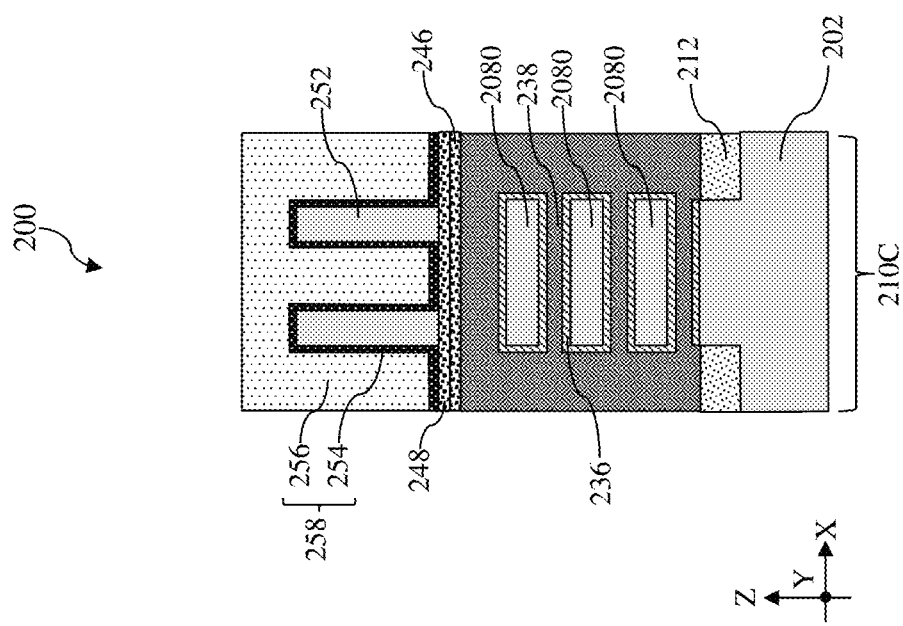

Referring to FIGS. 1 and 16, method 100 includes a block 120 where a fin element 252 from the epitaxial layer 250. With the second substrate 251 removed, the epitaxial layer 250 is patterned to form one or more fin element 252. In some embodiments where the semiconductor device 200 includes dual-fin transistors, two fin elements 252 are formed directly over the vertical stack of channel members 2080 as shown in FIG. 16. Other configurations are possible. For patterning purposes, a hard mask layer may be deposited over the epitaxial layer 250. The hard mask layer may be a single layer or a multilayer. In one example, the hard mask layer includes a silicon oxide layer and a silicon nitride layer over the silicon oxide layer. As shown in FIG. 16, the fin element 252 extends vertically along the Z direction from the second passivation layer 248 and extends lengthwise along the Y direction. The fin element 252 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin element 252 by etching the epitaxial layer 250. The etching process can include dry etching, wet etching, reactive ion etching (RIE), and/or other suitable processes.

In some implementations, the fin element 252 has a height (along the Z direction) greater than its width (along the Y direction). In some embodiments, the height of the fin element 252 may be between about 10 nm and about 70 nm and the width of the fin element 252 may be between about 3 nm and about 12 nm. When the semiconductor device 200 includes multiple fin elements 252, the fin elements 252 include a fin pitch between about 10 nm and about 50 nm. With respect to each fin element 252, the primary surfaces are the sidewalls. When the second substrate 251 is formed of silicon and has a top surface on the (100) surface, the primary surfaces of the fin element are on the (110) surface, which provide superior hole mobility to other surfaces.

Figure 17:
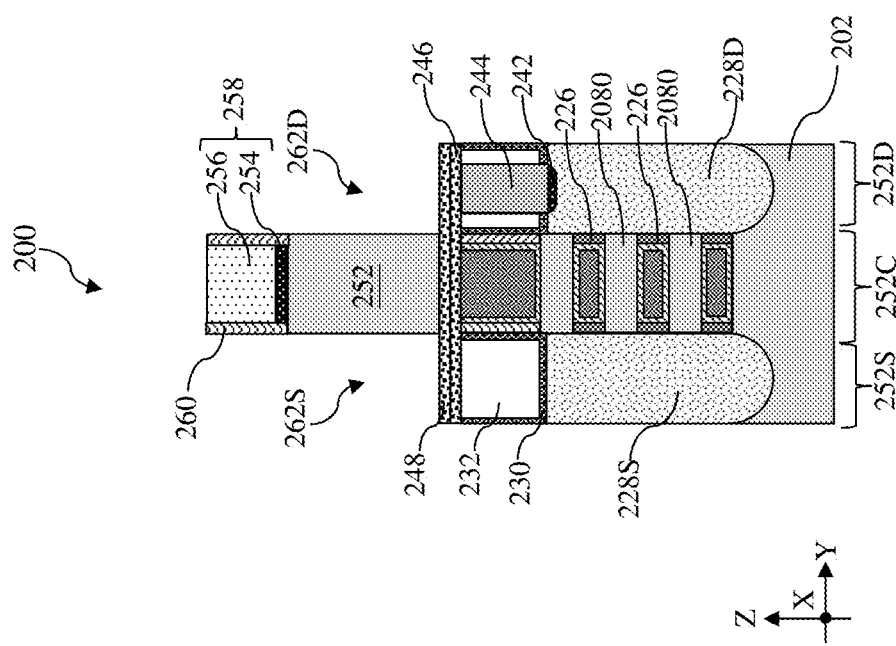

Referring to FIGS. 1, 16 and 17, method 100 includes a block 122 where a second dummy gate stack 258 is deposited over a channel region of the fin element 252. In some embodiments where a gate replacement process (or gate-last process) is adopted, the second dummy gate stack 258 is formed over the fin element 252 serves as placeholders for a functional gate structure. Other processes and configuration are possible. To form the second dummy gate stack 258, a dummy dielectric layer 254, a dummy gate electrode layer 256, and a gate-top hard mask layer (not shown) are deposited over the workpiece 200, including over the fin element 252. The deposition of these layers may include use of low-pressure CVD (LPCVD), CVD, plasma-enhanced CVD (PECVD), PVD, ALD, thermal oxidation, e-beam evaporation, or other suitable deposition techniques, or combinations thereof. The dummy dielectric layer 254 may include silicon oxide, the dummy gate electrode layer 256 may include polysilicon, and the gate-top hard mask layer may be a multi-layer that includes silicon oxide and silicon nitride. Using photolithography and etching processes, the gate-top hard mask layer is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Thereafter, using the patterned gate-top hard mask as the etch mask, the dummy dielectric layer 254 and the dummy gate electrode layer 256 are then etched to form the second dummy gate stack 258. As shown in FIG. 16, the second dummy gate stack 258 wraps over the fin element 252 and is disposed on the second passivation layer 248. Referring to FIG. 17, the portion of the fin element 252 underlying the second dummy gate stack 258 is a second channel region 252C. The second channel region 252C and the second dummy gate stack 258 also define a second source region 252S and a second drain region 252D that are not vertically overlapped by the second dummy gate stack 258. The second channel region 252C is disposed or sandwiched between the second source region 252S and the second drain region 252D along the Y direction.

As representatively shown in FIG. 17, operations at block 122 may include formation of a second gate spacer layer 260 over sidewalls of the second dummy gate stack 258. In some embodiments, the formation of the second gate spacer layer 260 includes conformal deposition of one or more dielectric layers over the workpiece 200. In an example process, the one or more dielectric layers are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof.

In some embodiments represented in FIG. 17, the second channel region 252C is directly over the first channel region 210C, the second source region 252S is directly over the first source region 210S, and the second drain region 252D is directly over the first drain region 210D. In other words, along the Z direction, the second channel region 252C may substantially overlap with the first channel region 210C, the second source region 252S may substantially overlap with the first source region 210S, and the second drain region 252D may substantially overlap with the first drain region 210D.

Referring to FIGS. 1 and 17, method 100 includes a block 124 where source/drain regions of the fin element 252 are recessed to form a second source recess 262S and a second drain recess 262D. In an example process, after the deposition of the second gate spacer layer 260, the workpiece 200 is etched in an etch process that selectively recesses the second source region 252S and the second drain region 252D of the fin element 252. The selective recess of the second source region 252S and the second drain region 252D results in the second source recess 262S and the second drain recess 262D. The etch process at block 124 may be a dry etch process or a suitable etch process. An example dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 17, the second passivation layer 248 in the second source region 252S and the second drain region 252D is exposed in the second source recess 262S and the second drain recess 262D.

Figure 18:
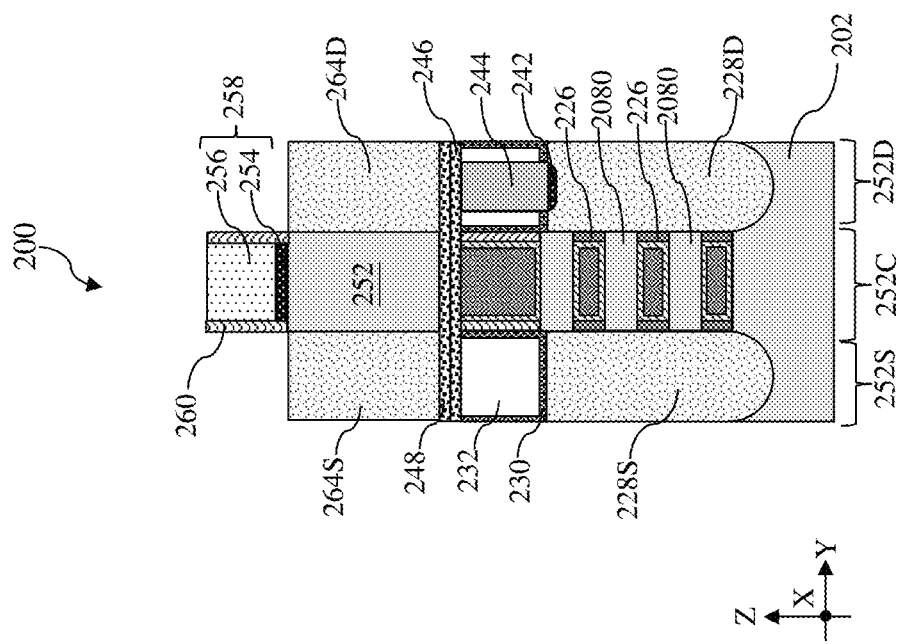

Referring to FIGS. 1 and 18, method 100 includes a block 126 where a second source feature 264S and a second drain feature 264D are formed. In some embodiments, the second source feature 264S and the second drain feature 264D may be formed using an epitaxial process, such as VPE, UHV-CVD, MBE, and/or other suitable processes. The epitaxial growth process may use gaseous and/or liquid precursors, which interact with the composition of the fin element 252. The second source feature 264S and the second drain feature 264D are therefore coupled to the fin element 252. In some embodiments, the second source feature 264S and the second drain feature 264D may be p-type source/drain features. Example p-type source/drain features may include Si, Ge, AlGaAs, SiGe, or other suitable material and may be in-situ doped during the epitaxial process by introducing a p-type dopant, such as boron (B), or ex-situ doped using an implantation process (i.e., a junction implant process). In one embodiment, the second source feature 264S and the second drain feature 264D include boron-doped silicon germanium (SiGe:B).

Figure 19:
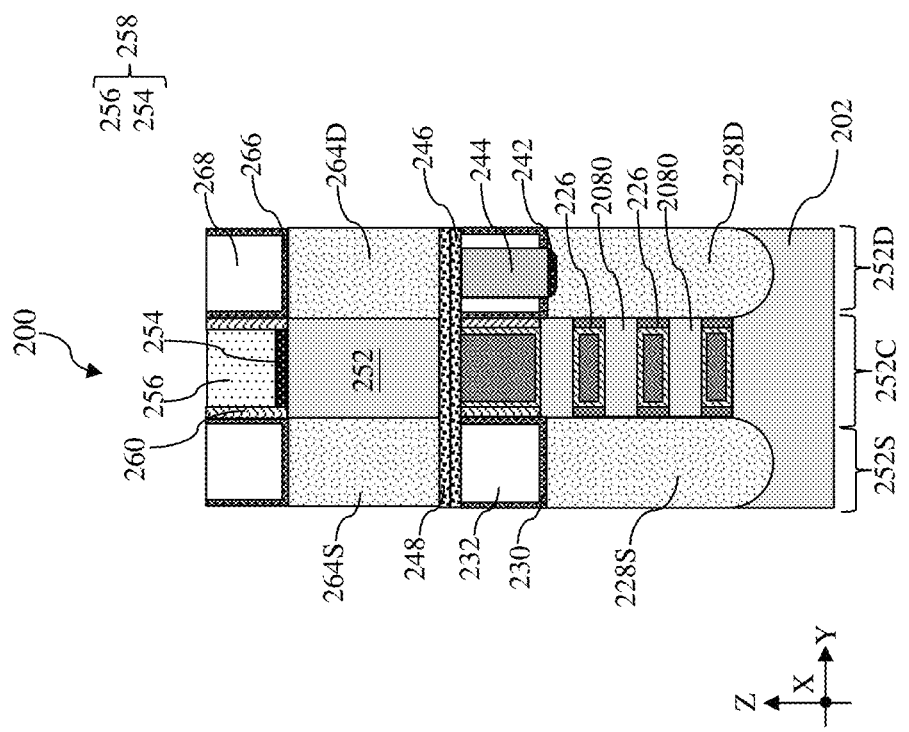

Referring to FIGS. 1, 19, 20, 21 and 22, method 100 includes a block 128 where the second dummy gate stack 258 is replaced with a second gate structure 274. Operations at block 128 include deposition of a second contact etch stop layer (CESL) 266 (shown in FIG. 19), deposition of a second interlayer dielectric (ILD) layer 268 (shown in FIG. 19), removal of the second dummy gate stack 258 (shown in FIG. 20), deposition of a second gate dielectric layer 270 (shown in FIG. 20), exposure of the first gate structure 240 (shown in FIG. 21), deposition of a second gate electrode layer 272 (shown in FIG. 22), and a planarization of the workpiece 200 to remove excess materials (shown in FIG. 22). The second CESL 266 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 19, the second CESL 266 may be deposited on top surfaces of the second source feature 264S and the second drain feature 264D. Thereafter, the second ILD layer 268 is deposited over the second CESL 266. Like the first ILD layer 232, the second ILD layer 268 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The second ILD layer 268 may be deposited by a PECVD process or other suitable deposition technique. In some embodiments, after formation of the second ILD layer 268, the workpiece 200 may be annealed to improve integrity of the second ILD layer 268. To remove excess materials and to expose top surfaces of the second dummy gate stack 258, a planarization process, such a chemical mechanical polishing (CMP) process may be performed.

Figure 20:
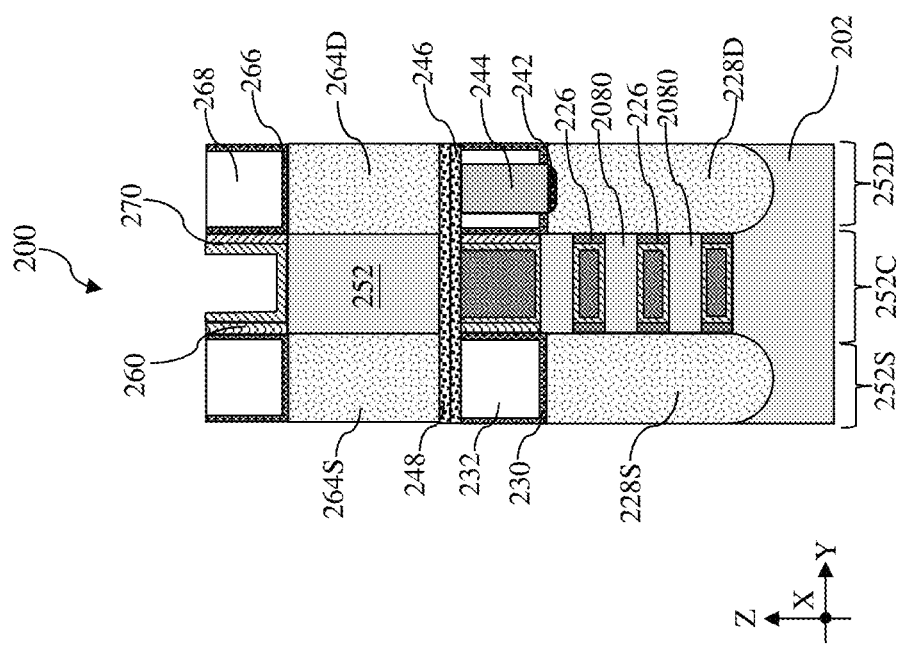

Reference is made to FIG. 20. With the exposure of the second dummy gate stack 258, block 128 proceeds to removal of the second dummy gate stack 258. The removal of the second dummy gate stack 258 may include one or more etching processes that are selective to the material in the second dummy gate stack 258. For example, the removal of the second dummy gate stack 258 may be performed using as a selective wet etch, a selective dry etch, or a combination thereof. After the removal of the second dummy gate stack 258, the second gate dielectric layer 270 is deposited over the second channel region 252C of the fin element 252. The second gate dielectric layer 270 may include an interfacial layer and a high-k dielectric layer. In some embodiments, the interfacial layer includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). The high-k dielectric layer is then deposited over the interfacial layer using ALD, CVD, and/or other suitable methods. The high-k dielectric layer may include hafnium oxide. Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

Figure 21:
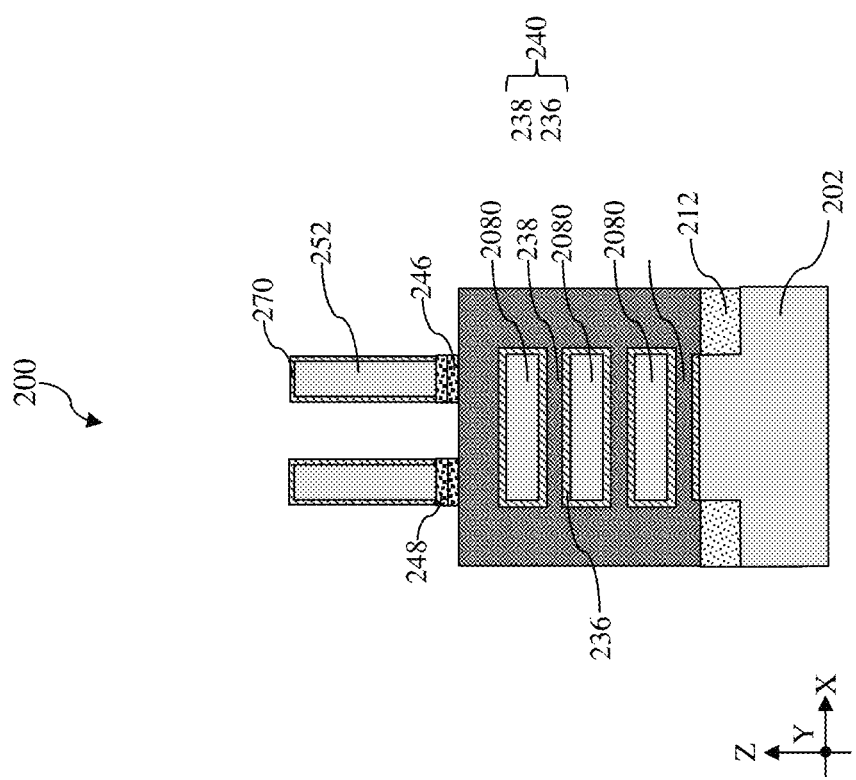
Figure 22:
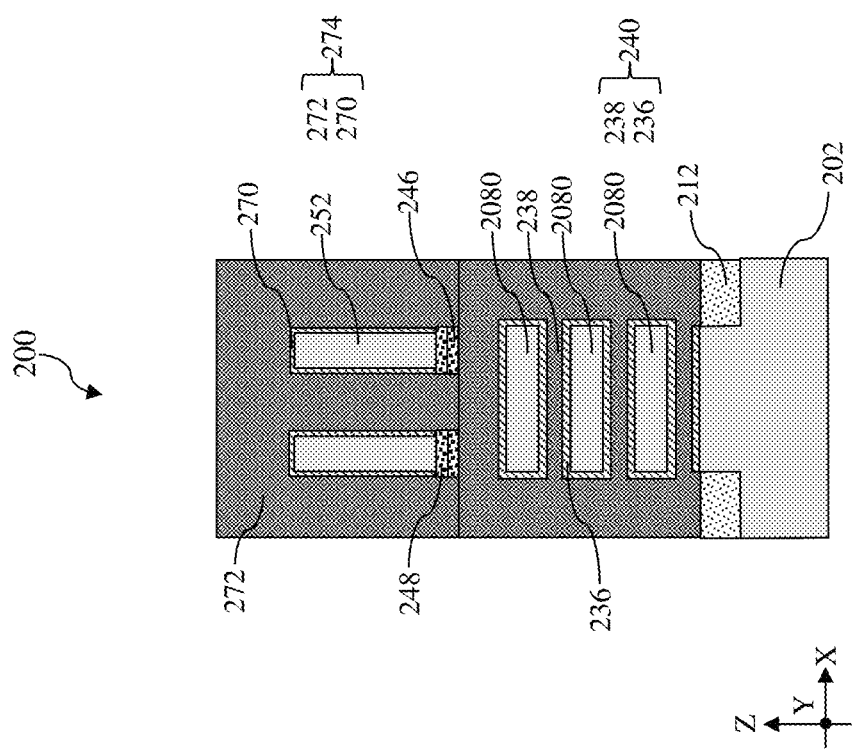

Referring to FIG. 21, after the deposition of the second gate dielectric layer 270, the workpiece 200 is subject to an anisotropic etch process to remove the second passivation layer 248 and the first passivation layer 246 that are not overlapped by the fin element 252 until the first gate structure 240 is exposed between the fin element 252. As shown in FIG. 21, the portions of the second passivation layer 248 and the first passivation layer 246 below the fin elements 252 may be substantially unetched and remain in place. A portion of the second gate dielectric layer 270 is disposed on the remaining second passivation layer 248. Thereafter, as illustrated in FIG. 22, the second gate electrode layer 272 is deposited over the second gate dielectric layer 270, the first gate structure 240 and the fin elements 252 using ALD, PVD, CVD, e-beam evaporation, or other suitable methods. The second gate electrode layer 272 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the second gate electrode layer 272 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. As shown in FIG. 22, the second gate dielectric layer 270 and the second gate electrode layer 272 together constitute the second gate structure 274. Because the second gate electrode layer 272 comes in direct contact with the first gate electrode layer 238, operations at block 128 electrically couple the second gate structure 274 to the first gate structure 240.

Referring to FIGS. 1, 23-25, 32, 33, 38, and 39, method 100 includes a block 130 where an upper source contact 280 and an upper drain contact 282 are formed. In an example process shown in FIG. 23, lithography processes are used to form contact openings that expose the second source feature 264S and the second drain feature 264D. To reduce contact resistance, a silicide layer 281 may be formed on the second source feature 264S and the second drain feature 264D by depositing a metal layer over the second source feature 264S and the second drain feature 264D and performing an anneal process to bring about silicidation between the metal layer and the second source feature 264S and the second drain feature 264D. Suitable metal layer may include titanium (Ti), tantalum (Ta), nickel (Ni), cobalt (Co), or tungsten (W). The silicide layer 281 may include titanium silicide (TiSi), titanium silicon nitride (TiSiN), tantalum silicide (TaSi), tungsten silicide (WSi), cobalt silicide (CoSi), or nickel silicide (NiSi). After the formation of the silicide layer 281, a metal fill layer may be deposited into the contact opening. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). A planarization process may follow to remove excess materials, thereby forming the upper source contact 280 over the second source feature 264S and the upper drain contact 282 over the second drain feature 264D. Due to the planarization process, top surfaces of the upper source contact 280, the upper drain contact 282, the second CESL 266, and the second ILD layer 268 are coplanar.

Figure 24:
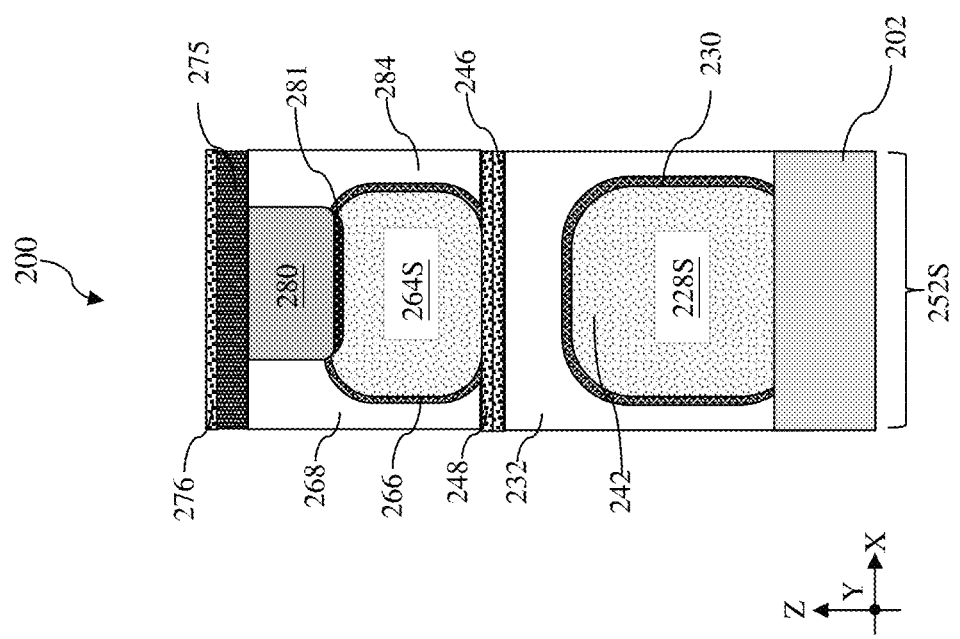
Figure 25:
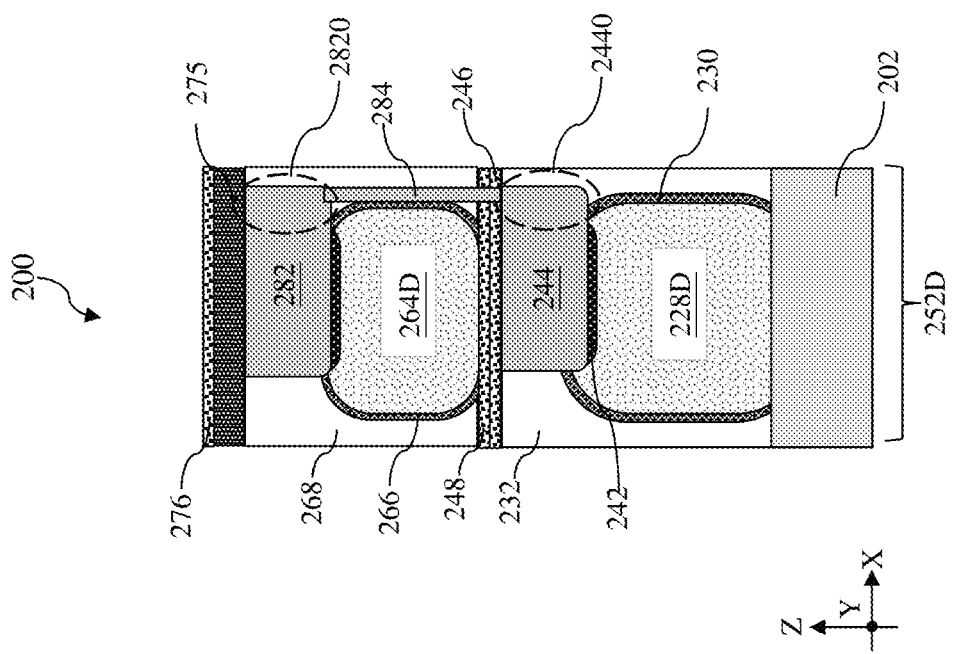
Figure 26:
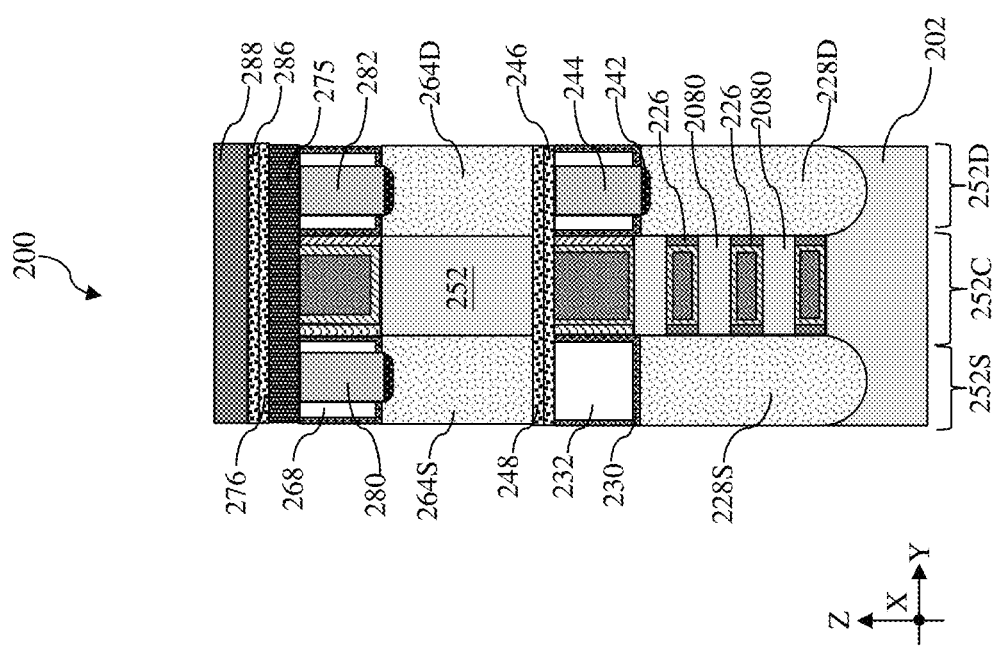

In some embodiments represented in FIG. 24, the upper source contact 280 is disposed over the second source feature 264S and does not overhang the second source feature 264S. In contrast, as shown in FIG. 25, the upper drain contact 282 overhangs the first drain feature 228D along the X direction. The upper drain contact 282 include a second overhang portion 2820 that overhangs the second drain feature 264D by about 2 nm and about 20 nm. In some embodiments, the second overhang portion 2820 is disposed directly over the first overhang portion and this configuration allows a first conductive feature 284 to be formed to couple the lower drain contact 244 and the upper drain contact 282. In some implementations, after the formation of the contact opening over the second drain feature 264D, a via opening is formed through the second ILD layer 268, the second passivation layer 248, and the first passivation layer 246 to expose the lower drain contact 244. Before the metal fill layer is deposited into the contact opening, the first conductive feature 284 may be deposited in a bottom-up manner. An example bottom-up deposition may include use of metal-organic precursors that may preferentially deposited on metal surfaces. As shown in FIG. 25, the first conductive feature 284 may extend adjacent a sidewall of the second drain feature 264D. The first conductive feature 284 may come in contact with the second drain feature 264D but does not vertically penetrate the second drain feature 264D.

Figure 32:
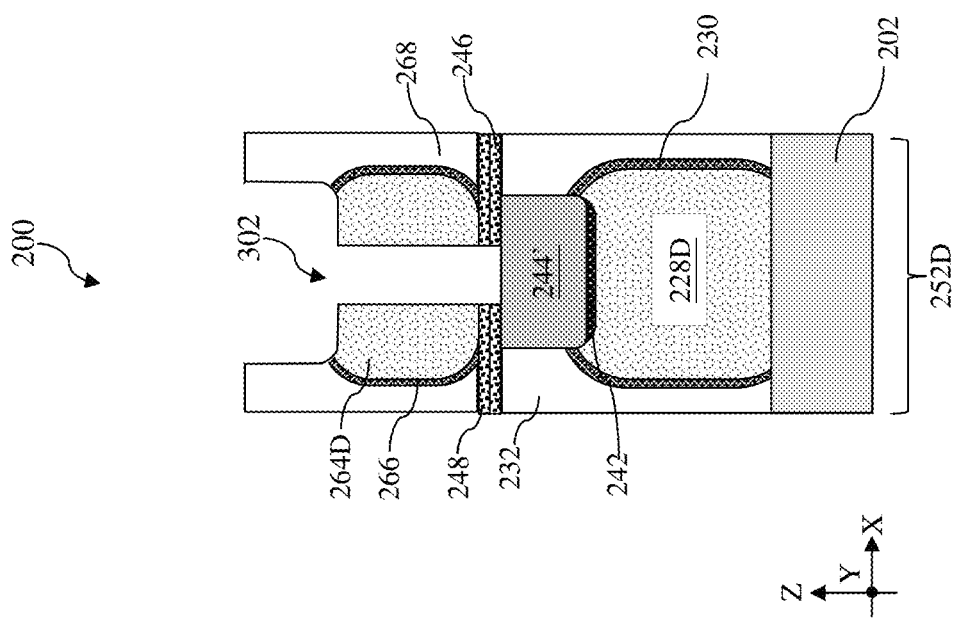
Figure 33:
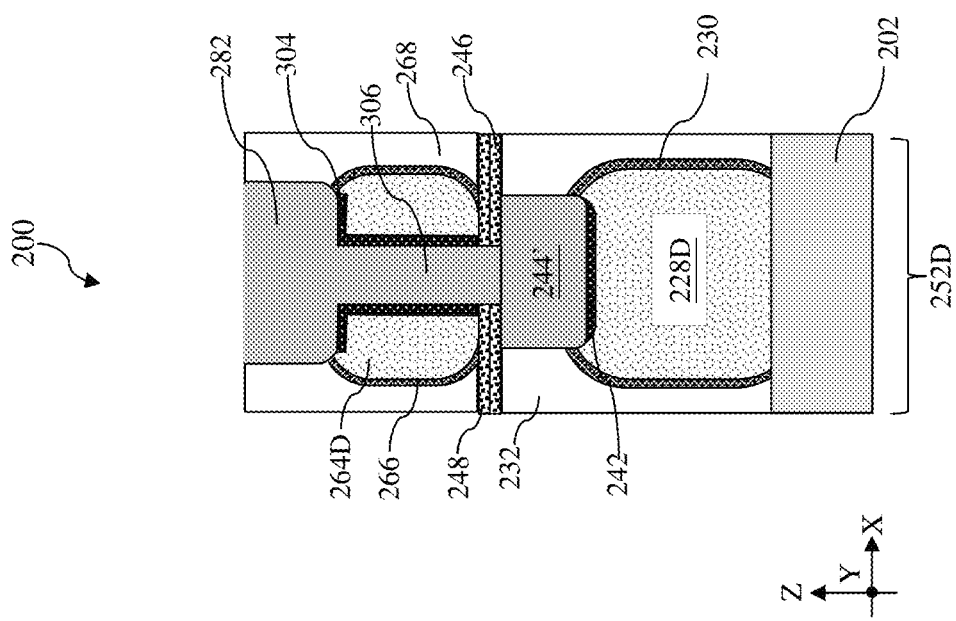

In some alternative embodiments illustrated in FIGS. 32 and 33, an alternative lower drain contact 244' does not overhang the first drain feature 228D and an alternative upper drain contact 282' does not overhang the second drain feature 264D. The contact opening for the alternative upper drain contact 282' further include a first via contact opening 302 that extends through the second drain feature 264D, the second passivation layer 248, and the first passivation layer 246 to expose the alternative lower drain contact 244'. In these alternative embodiments, when the metal fill layer is deposited into the contact opening and the first via contact opening 302, a second conductive feature 306 is formed along with the upper drain contact 280. In some embodiments, a silicide layer 304 may be disposed between the upper drain contact 280 and the second drain feature 264D as well as between the second conductive feature 306 and the second drain feature 264D. A composition and formation of the silicide layer 304 may be similar to those of the silicide layer 242. The silicide layer 304 is not formed between the second conductive feature 306 and second passivation layer 248 or between the second conductive feature 306 and first passivation layer 246. The second conductive feature 306 vertically extends through the second drain feature 264D, the second passivation layer 248, and the first passivation layer 246.

In some alternative embodiments illustrated in FIGS. 32 and 33, an alternative lower drain contact 244' does not overhang the first drain feature 228D and an alternative upper drain contact 282' does not overhang the second drain feature 264D. The contact opening for the alternative upper drain contact 282' further include a first via contact opening 302 that extends through the second drain feature 264D, the second passivation layer 248, and the first passivation layer 246 to expose the alternative lower drain contact 244'. In these alternative embodiments, when the metal fill layer is deposited into the contact opening and the first via contact opening 302, a second conductive feature 306 is formed along with the alternative upper drain contact 282'. In some embodiments, a silicide layer 304 may be disposed between the alternative upper drain contact 282' and the second drain feature 264D as well as between the second conductive feature 306 and the second drain feature 264D. A composition and formation of the silicide layer 304 may be similar to those of the silicide layer 242. The silicide layer 304 is not formed between the second conductive feature 306 and second passivation layer 248 or between the second conductive feature 306 and first passivation layer 246. The second conductive feature 306 vertically extends through the second drain feature 264D, the second passivation layer 248, and the first passivation layer 246.

Figure 38:
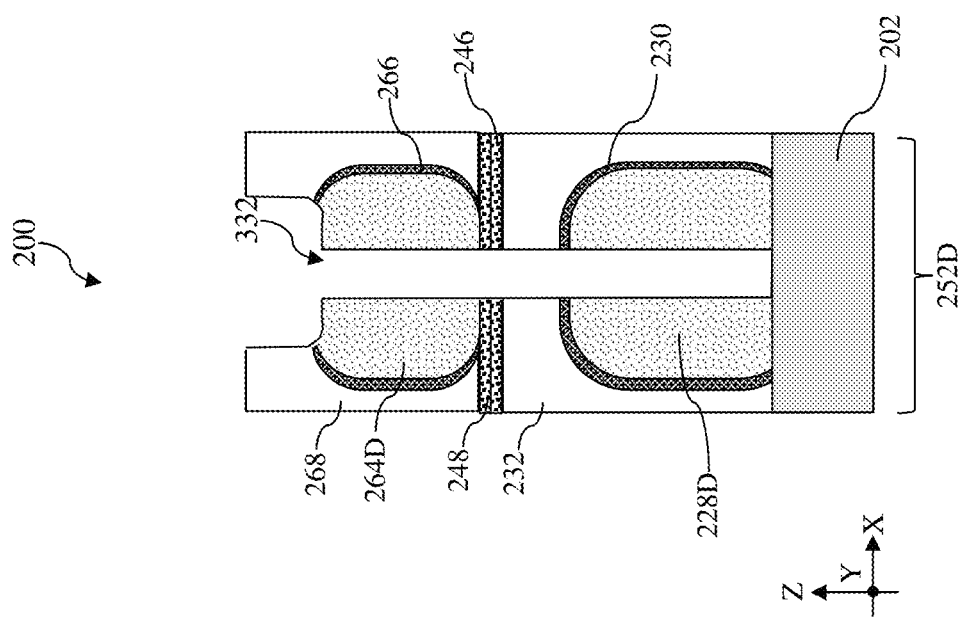
Figure 39:
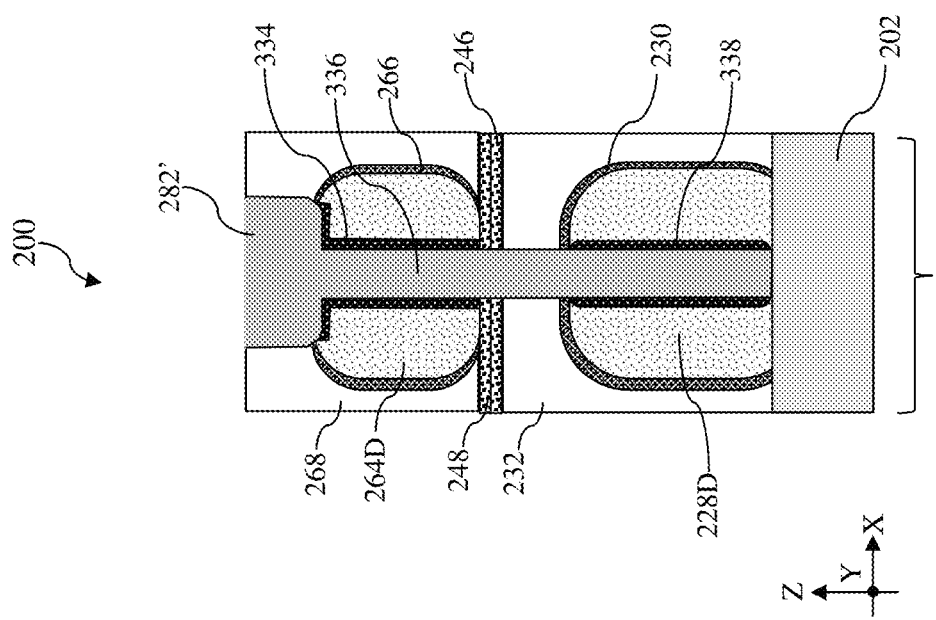

In some further alternative embodiments illustrated in FIGS. 38 and 39, the lower drain contact 244 is omitted and the alternative upper drain contact 282' does not overhang the second drain feature 264D. Instead, the contact opening for the alternative upper drain contact 282' further include a second via contact opening 332 that extends through the second drain feature 264D, the second passivation layer 248, the first passivation layer 246, the first ILD layer 232, the first CESL 230, and the first drain feature 228D. In these alternative embodiments, when the metal fill layer is deposited into the contact opening and the second via contact opening 332, a third conductive feature 336 is formed along with the alternative upper drain contact 282'. In some embodiments, a silicide layer 334 may be disposed between the alternative upper drain contact 282' and the second drain feature 264D as well as between the third conductive feature 336 and the second drain feature 264D. In addition, a silicide layer 338 is formed between the third conductive feature 336 and the first drain feature 228D. A composition and formation of the silicide layers 334 and 338 may be similar to those of the silicide layer 242. The third conductive feature 336 vertically extends through the second drain feature 264D, the second passivation layer 248, the first passivation layer 246, the first ILD layer 232, the first CESL 230. The third conductive feature 336 may or may not come in contact with the first substrate 202.

Figure 23:
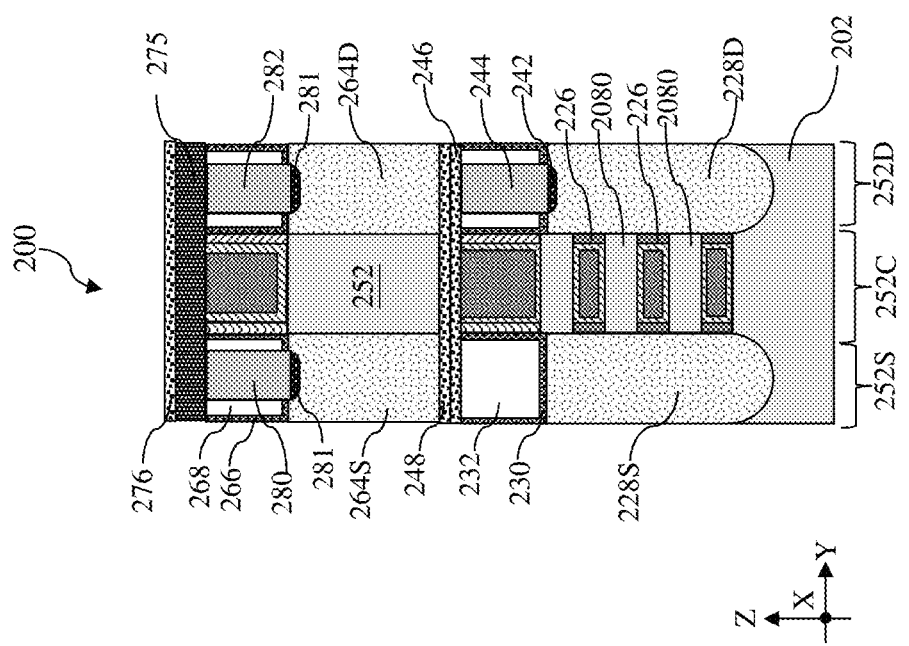

After the formation of the upper source contact 280 and the upper drain contact 282 (or the alternative upper drain contact 282'), an interconnect structure 275 may be formed over the workpiece 200. Although not explicitly shown in the figures, the interconnect structure 275 may include a plurality of interconnect layers, each of which includes conductive lines and conductive vias embedded in a dielectric layer. The dielectric layer may be referred to an inter-metal layer (IMD) and may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Referring to FIGS. 23, 24, and 25, a third passivation layer 276 is deposited on the interconnect structure 275 to facilitate bonding of the workpiece 200 to further structures. In one embodiment, the third passivation layer 276 includes silicon oxide. In some alternative embodiments, the third passivation layer 276 may include silicon nitride, silicon carbonitride, silicon oxycarbonitride, aluminum oxide, or hafnium oxide.

Figure 27:
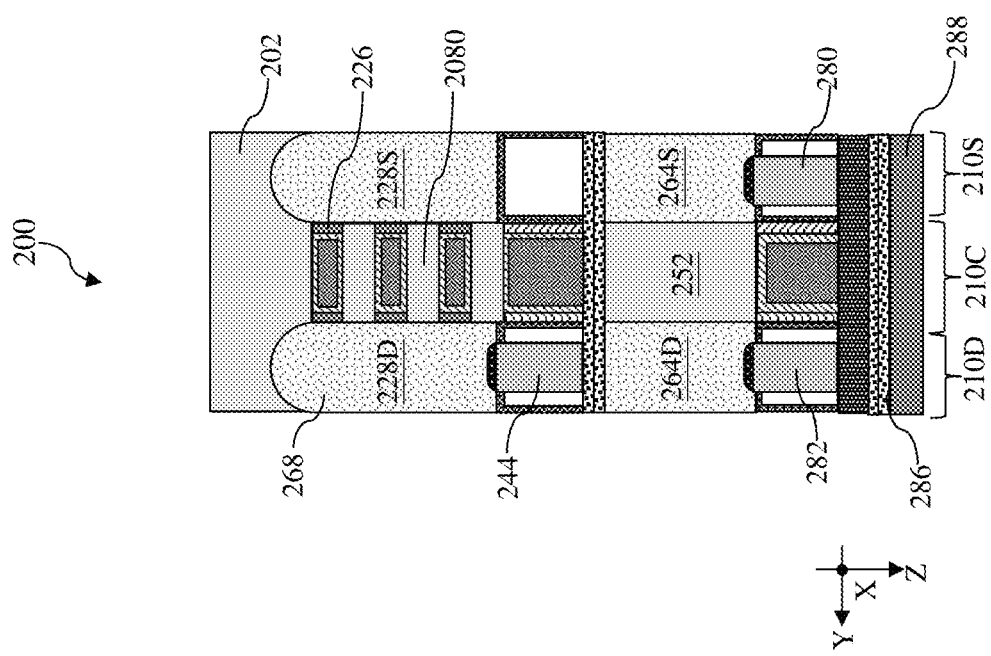

Referring to FIGS. 1, 26-31, and 34-37, method 100 includes a block 132 where a backside source contact 296 is formed to couple to the first source feature 228S. Operations at block 134 may include deposition of a fourth passivation layer 286 on a carrier substrate 288 (shown in FIG. 26), bonding the fourth passivation layer 286 to the third passivation layer 276 (shown in FIG. 26), flipping the workpiece 200 to point the first substrate 202 upward (shown in FIG. 27), removing a portion of first substrate 202 (shown in FIG. 28), and formation of the backside source contact 296 over the first source feature 228S (shown in FIG. 28). The carrier substrate 288 may include silicon or silicon carbide. In one embodiment, the fourth passivation layer 286 includes silicon oxide. In some alternative embodiments, the fourth passivation layer 286 may include silicon nitride, silicon carbonitride, silicon oxycarbonitride, aluminum oxide, or hafnium oxide. The fourth passivation layer 286 may be deposited on the carrier substrate 288 using CVD or a suitable deposition process. The carrier substrate 288 is bonded to the workpiece 200 by a direct bonding between the third passivation layer 276 and the fourth passivation layer 286. An example direct bonding process is described above and will not be repeated here. After bonding the carrier substrate 288 to the workpiece 200, the workpiece 200 is flipped over with the first substrate pointing upward, as shown in FIG. 27. The first substrate 202 is ground and/or planarized by a grinding process and/or a chemical mechanical polishing (CMP) process until the isolation feature 212, the first source feature 228S, and the first drain feature 228D are exposed on the top surface.

Figure 28:
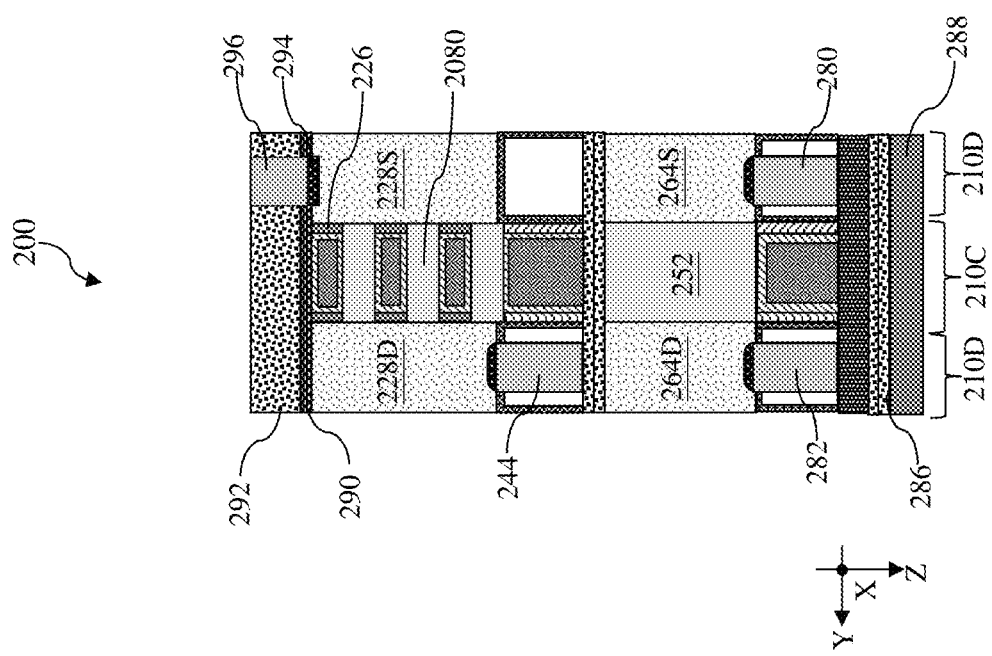

Referring to FIG. 28, a backside contact etch stop layer (BCESL) 290 is deposited over the exposed isolation feature 212, first source feature 228S, and first drain feature 228D. Like the first CESL 230 and the second CESL 266, the BCESL 290 may include silicon nitride, silicon oxynitride, and/or other materials known in the art and may be formed by ALD, plasma-enhanced chemical vapor deposition (PECVD) process and/or other suitable deposition or oxidation processes. Thereafter, the backside dielectric layer 292 is deposited over the BCESL 290. The backside dielectric layer 292 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The backside dielectric layer 292 may be deposited by a PECVD process or other suitable deposition technique.

Figure 29:
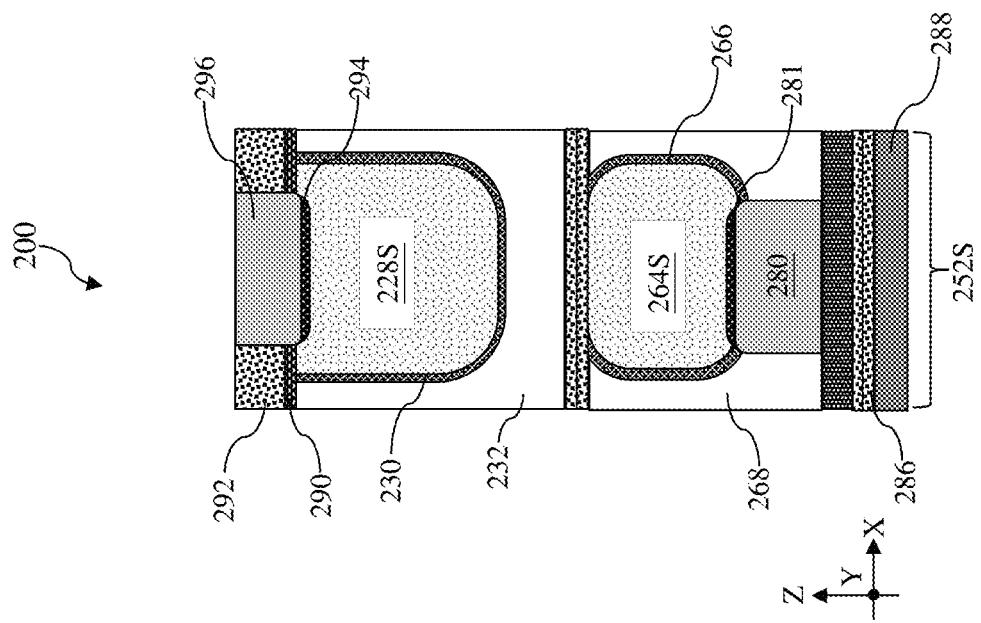
Figure 30:
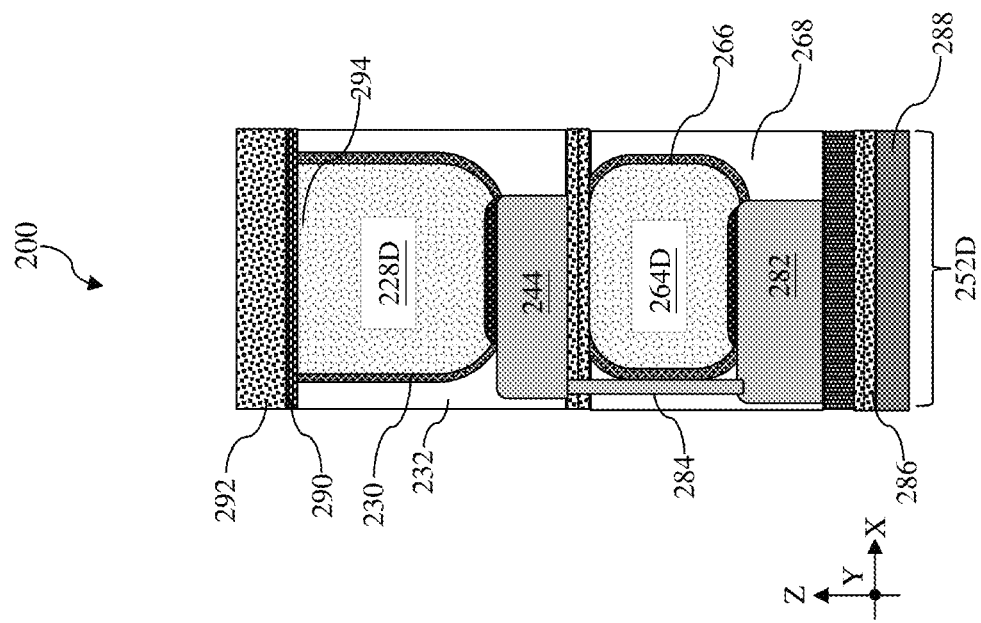

Reference is still made to FIG. 28. To form the backside source contact 296, a backside contact opening is formed to expose the first source feature 228S. A backside silicide layer 294 and a backside source contact 296 are formed in the backside contact opening. The backside silicide layer 294 may include titanium silicide (TiSi), titanium silicon nitride (TiSiN), tantalum silicide (TaSi), tungsten silicide (WSi), cobalt silicide (CoSi), or nickel silicide (NiSi). The backside source contact 296 may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). FIGS. 29 and 30 illustrate fragmentary cross-sectional view of the second source region 252S and the second drain region 252D with the workpiece 200 now flipped upside-down, according to some embodiments of the present disclosure.

Figure 34:
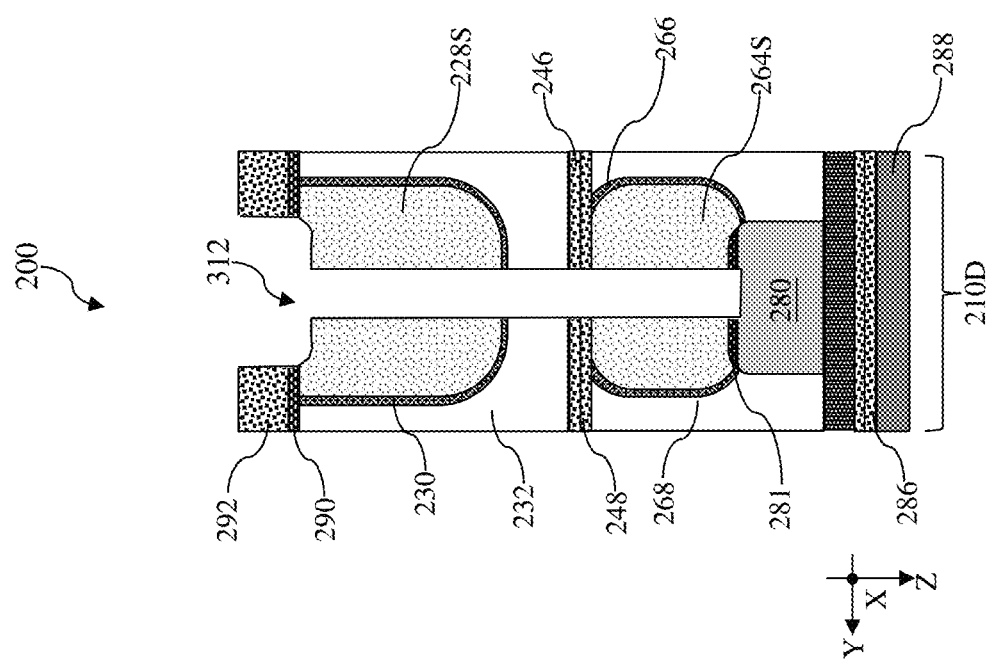
Figure 35:
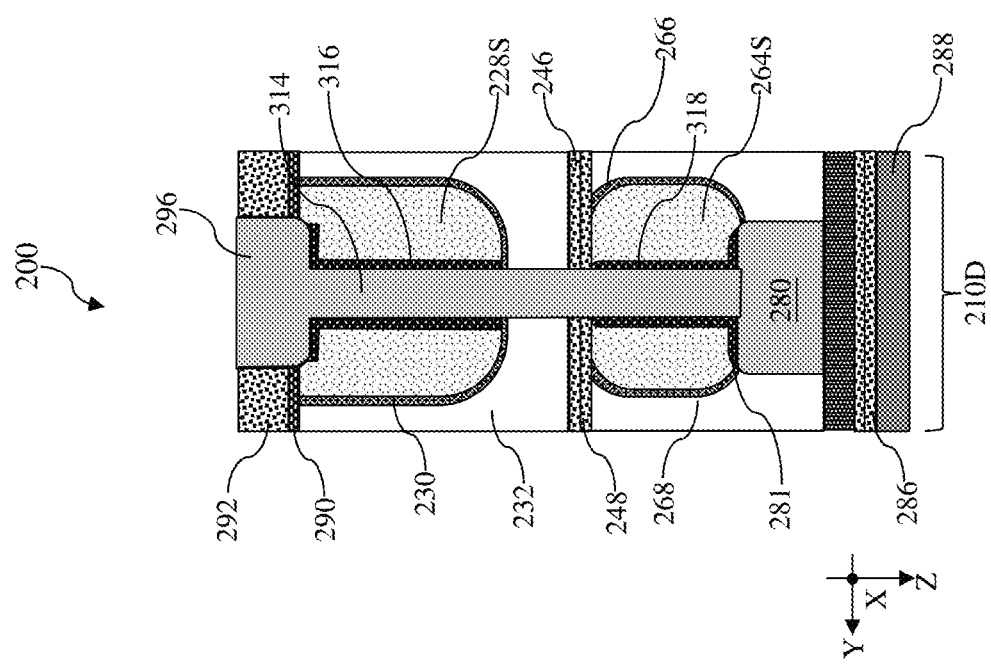

Alternative embodiments of the backside source contact 296 are shown in FIGS. 34-37. In a first alternative embodiment illustrated in FIGS. 34 and 35, a first through via opening 312 may be formed after the formation of the backside contact opening and a fourth conductive feature 314 is deposited in the first through via opening 312. As shown in FIGS. 34 and 35, the first through via opening 312 and the fourth conductive feature 314 extend through the first source feature 228S, the first CESL 230, the first ILD layer 232, the first passivation layer 246, the second passivation layer 248, the second source feature 264S, and the silicide layer 281, to couple to the upper source contact 280. In some implementations represented in FIG. 35, a silicide layer 316 may be formed between the fourth conductive feature 314 and the first source feature 228S and a silicide layer 318 may be formed between the fourth conductive feature 314 and the second source feature 264S. The composition of the silicide layers 316 and 318 may be similar to the silicide layer 242 and detailed description of them is omitted for brevity. Similarly, the fourth conductive feature 314 is similar to the backside source contact 296 in terms of materials and detailed description of it is omitted for brevity as well.

Figure 36:
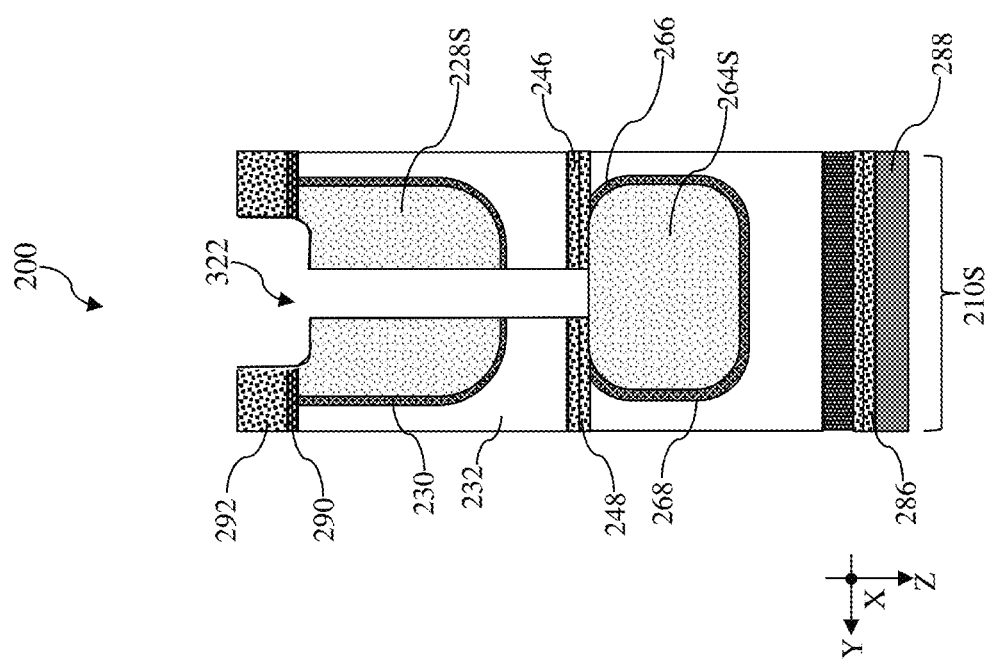
Figure 37:
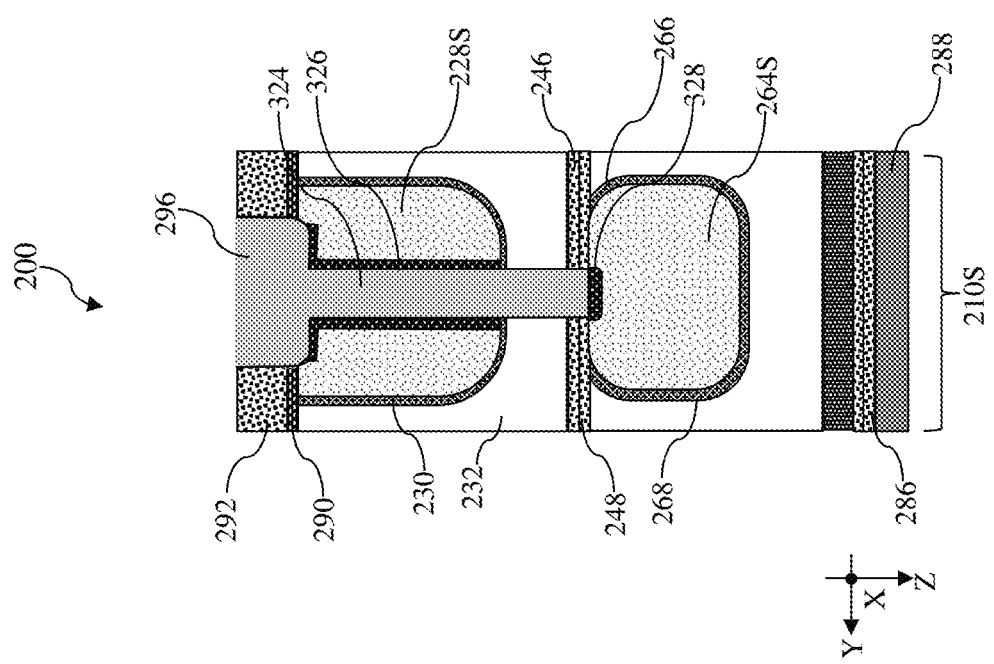

In a second alternative embodiment illustrated in FIGS. 36 and 37, a second through via opening 322 may be formed after the formation of the backside contact opening and a fifth conductive feature 324 is deposited in the second through via opening 322. Different from the first alternative embodiment shown in FIGS. 34 and 35, the upper source contact 280 is omitted. As shown in FIGS. 36 and 37, the second through via opening 322 and the fifth conductive feature 324 extend through the first source feature 228S, the first CESL 230, the first ILD layer 232, the first passivation layer 246, and the second passivation layer 248, to couple to the second source feature 264S. In some implementations represented in FIG. 37, a silicide layer 326 may be formed between the fifth conductive feature 324 and the first source feature 228S and a silicide layer 328 may be formed between the fifth conductive feature 324 and the second source feature 264S. The composition of the silicide layers 326 and 328 may be similar to the silicide layer 242 and detailed description of them is omitted for brevity. Similarly, the fifth conductive feature 324 is similar to the backside source contact 296 in terms of materials and detailed description of it is omitted for brevity as well.

Referring to FIG. 1, method 100 includes a block 134 where further processes are performed. Such further process may include deposition of a third ILD layer over the backside source contact 296 and formation of a backside power rail in the third ILD layer.

Figure 31:
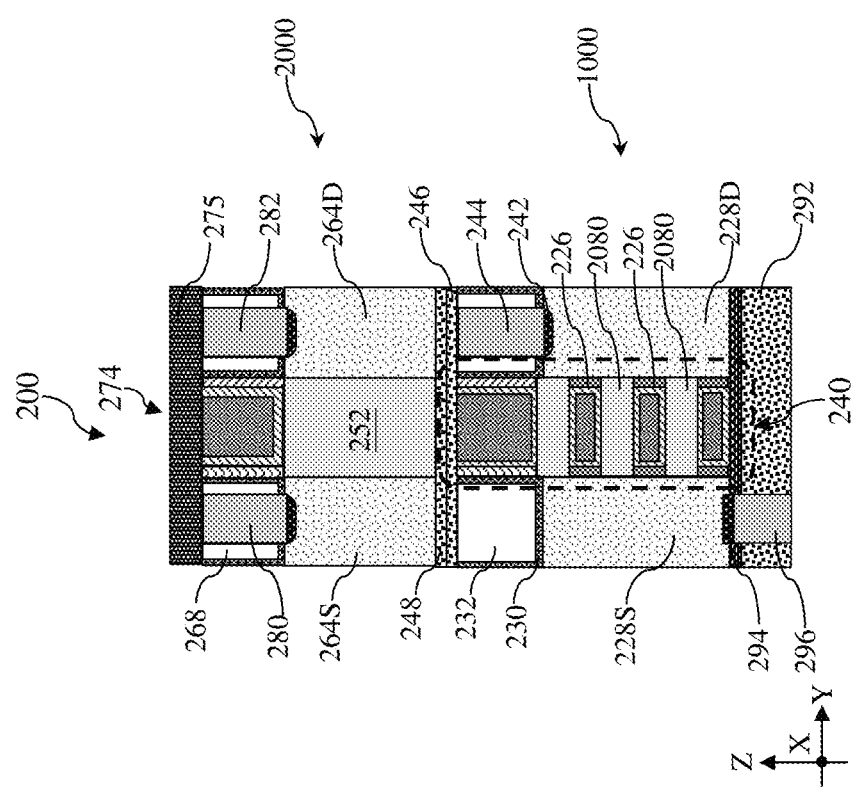

Reference is now made to FIG. 31. Upon conclusion of the operations in method 100, the semiconductor device 200 includes an n-type MBC transistor 1000 as a bottom transistor and a p-type FinFET 2000 as a top device. In FIG. 31, the p-type FinFET 2000 is disposed over the n-type MBC transistor 1000. The n-type MBC transistor 1000 includes a plurality of channel members 2080 that are vertically stacked along the Z direction. Along the Y direction, the channel members 2080 extend between the first source feature 228S and the first drain feature 228D. The first gate structure 240 wraps around each of the channel members 2080. The p-type FinFET 2000 includes one or more fin elements 252 (one shown in FIG. 31) that rise from the second passivation layer 248. Along the Y direction, the fin element 252 extends between the second source feature 264S and the second drain feature 264D. The second gate structure 274 wraps over the fin element 252. The first source feature 228S of the n-type MBC transistor 1000 and the second source feature 264S of the p-type FinFET 2000 are aligned along the Z direction. The first drain feature 228D of the n-type MBC transistor 1000 and the second drain feature 264D of the p-type FinFET 2000 are aligned along the Z direction. This vertical alignment orientation allows formation of conductive features that electrically couple the first source feature 228S and the second source feature 264S or the first drain feature 228D and the second drain feature 264D.

In embodiments where the second substrate 251 are silicon substrates having a (100) surface, the semiconductor device 200 in FIG. 31 improve hole mobility for the p-type FinFET 2000. In these embodiments, the epitaxial layer 250 deposited on the second substrate 251 follows the crystal orientation of the second substrate 251. When the epitaxial layer 250 is patterned to form the fin element 252. The sidewalls of the fin element 252 are on the (110) surface, which provides greater hole mobility than the (100) surface.

Because the sidewalls of the fin element 252 are the primary surfaces of the fin element 252, the fin element 252 possesses improved hole mobility and the p-type FinFET 2000 has improved drive current.

Figure 40:
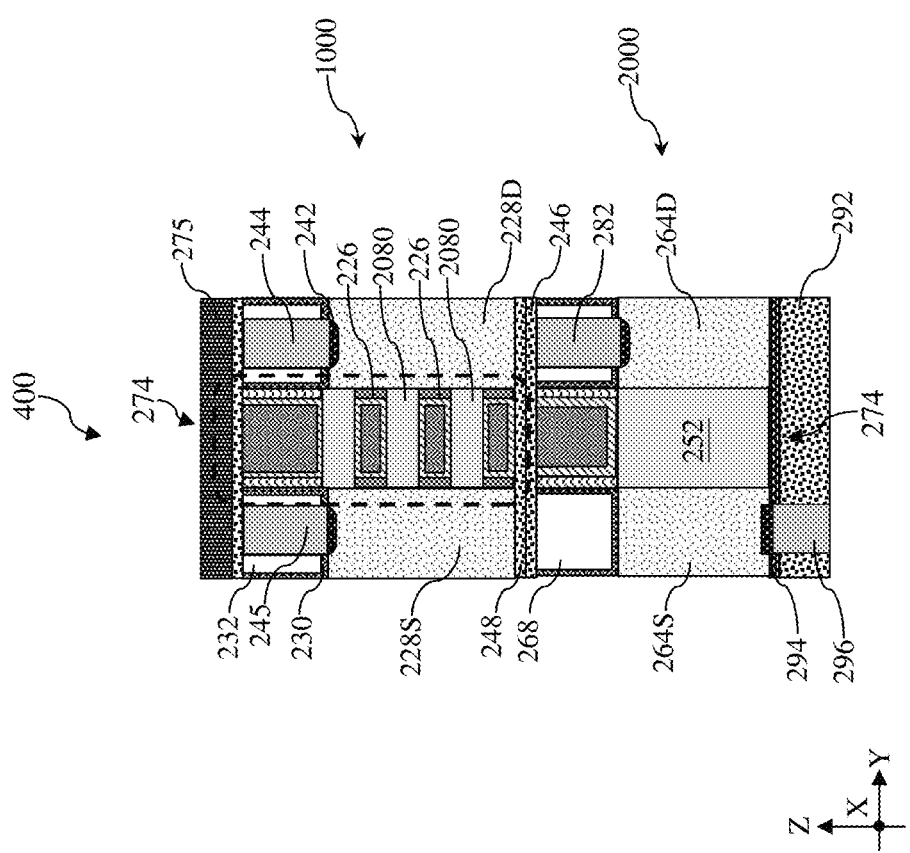
FIG. 40 illustrates an alternative embodiment of the semiconductor device, according to one or more aspects of the present disclosure.

Although most of the present disclosure describe processes and structures for the semiconductor device 200 shown in FIG. 31, embodiments of the present disclosure are not limited to those that include a p-FinFET over an n-type MBC. FIG. 40 illustrates an alternative configuration in a semiconductor device 400. Different from the semiconductor device 200 in FIG. 31, the semiconductor device 400 includes the p-type FinFET 2000 as a bottom transistor and the n-type MBC transistor 1000 as a top device. That is, in the semiconductor device 400, the n-type MBC transistor 1000 is disposed over the p-type FinFET 2000. Because the p-type FinFET 2000 is now the bottom transistor, the upper source contact 280 is omitted and an alternative source contact 245 is formed to couple to the first source feature 228S by way of a silicide layer. Because the alternative source contact 245 is similar to the lower drain contact 244, detailed description of the alternative source contact 245 is omitted for brevity. Similar to the semiconductor device 200 in FIG. 31, the first drain feature 228D of the n-type MBC transistor 1000 and the second drain feature 264D of the p-type FinFET 2000 are aligned along the Z direction. This vertical alignment orientation allows formation of conductive features that electrically couple the first source feature 228S and the second source feature 264S or the first drain feature 228D and the second drain feature 264D. In both the semiconductor device 200 and the alternative semiconductor device 400, the fin element 252 is disposed on the second passivation layer 248 to provide improved gate control.

In one exemplary aspect, the present disclosure is directed to a semiconductor device. The semiconductor device includes a first transistor and a second transistor disposed over the first transistor. The first transistor includes a plurality of channel members vertically stacked over one another, and a first source/drain feature adjoining the plurality of channel members. The second transistor includes a fin structure, and a second source/drain feature adjoining the fin structure. The semiconductor device further includes a conductive feature electrically connecting the first source/drain feature and the second source/drain feature.

In some embodiments, the first transistor further includes a first gate structure that wraps around each of the plurality of channel members. The second transistor further includes a second gate structure that wraps over the fin structure. The first gate structure is in contact with the second gate structure. In some embodiments, the plurality of channel members include silicon (Si) and the fin structure includes silicon germanium (SiGe). In some implementations, the plurality of channel members include silicon (Si), germanium (Ge), silicon germanium (SiGe), molybdenum disulfide ($MoS_2$), tungsten diselenide ($WSe_2$), or hafnium ditelluride ($HfTe_2$) and the fin structure includes silicon (Si), germanium (Ge), silicon germanium (SiGe), molybdenum disulfide ($MoS_2$), tungsten diselenide ($WSe_2$), or hafnium ditelluride ($HfTe_2$). In some instances, the conductive feature extends through the second source/drain feature. In some embodiments, the conductive feature extends through the first source/drain feature. In some instances, the first transistor further includes a first source/drain contact disposed over the first source/drain feature, the second transistor further includes a second source/drain contact disposed over the second source/drain feature, and the conductive feature is in direct contact with the first source/drain contact and the second source/drain contact. In some embodiments, the first transistor further includes a third source/drain contact disposed below the first source/drain feature, the second transistor further includes a fourth source/drain contact disposed over the second source/drain feature, and the conductive feature is in direct contact with the third source/drain contact and the fourth source/drain contact.

In another exemplary aspect, the present disclosure is directed to a semiconductor device. The semiconductor device includes a first transistor and a second transistor disposed over the first transistor. The first transistor include a first source feature and a first drain feature, and a plurality of channel members vertically stacked over one another and extending between the first source feature and the first drain feature. The second transistor includes a second source feature and a second drain feature, and a fin structure extending between the second source feature and the second drain feature. The second source feature is directly over the first source feature and the second drain feature is directly over the first drain feature.

In some embodiments, the first transistor further includes a first drain contact disposed over the first drain feature and the second transistor further includes a second drain contact disposed over the second drain feature. In some implementations, the first drain feature includes silicon doped with an n-type dopant, the second drain feature includes silicon germanium doped with a p-type dopant, and the first drain contact and the second drain contact include a metal. In some implementations, the first drain contact overhangs the first drain feature and the second drain contact overhangs the second drain feature. In some embodiments, the semiconductor device may further include a first conductive feature electrically coupling the first drain contact and the second drain contact. In some instances, the first conductive feature extends through the second drain feature. In some implementations, the first transistor may further include a first source contact disposed below the first drain feature and the second transistor may further include a second source contact disposed over the second drain feature.

In yet another exemplary aspect, the present disclosure is directed to a method. The method includes forming a first transistor on a first substrate, wherein the first transistor includes a first source feature and a first drain feature, a plurality of channel members vertically stacked over one another and extending between the first source feature and the first drain feature, and a first gate structure wrapping around each of the plurality of channel members. The method may further include depositing a first passivation layer over the first transistor, forming an epitaxial layer over a second substrate, depositing a second passivation layer over the epitaxial layer, bonding the second passivation layer to the first passivation layer, after the bonding, removing the second substrate, patterning the epitaxial layer to form a fin structure over the plurality of channel members, and forming a second gate structure to wrap over the fin structure, wherein the second gate structure is in contact with the first gate structure.

In some embodiments, the epitaxial layer includes silicon germanium. In some implementations, the method may further include before the forming of the second gate structure, forming a dummy gate stack over a channel region of the fin structure, recessing a source region and a drain region of the fin structure to form a source recess and a drain recess, the source region and the drain region sandwiching the channel region, forming a second source feature in the source recess and a second drain feature in the drain recess, depositing a dielectric layer over the second source feature and the second drain feature, and removing the dummy gate stack. In some instances, the method may further include, after the forming of the second gate structure, forming a drain contact opening through the second drain feature and the first drain feature and forming a conductive feature in the drain contact opening. In some instances, the method may further include after the forming of the second gate structure, depositing a third passivation layer over the second gate structure, depositing a fourth passivation layer over a third substrate, bonding the fourth passivation layer to the third passivation layer, removing the first substrate, and forming a backside source contact electrically coupled to the first source feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first transistor comprising:
      a plurality of channel members vertically stacked over one another, and
      a first source/drain feature adjoining the plurality of channel members;
   a second transistor disposed over the first transistor, the second transistor comprising:
      a fin structure, and
      a second source/drain feature adjoining the fin structure;
   a conductive feature electrically connecting the first source/drain feature and the second source/drain feature; and
   at least one passivation layer extending continuously from between the plurality of channel members and the fin structure to between the first source/drain feature and the second source/drain feature,
   wherein an entirety of the at least one passivation layer is disposed below the fin structure.

2. The semiconductor device of claim 1,
   wherein the first transistor further comprises a first gate structure that wraps around each of the plurality of channel members,
   wherein the second transistor further comprises a second gate structure that wraps over the fin structure,
   wherein the first gate structure is in contact with the second gate structure.

3. The semiconductor device of claim 1,
   wherein the plurality of channel members comprise silicon (Si),
   wherein the fin structure comprises silicon germanium (SiGe).

4. The semiconductor device of claim 1,
   wherein the plurality of channel members comprise silicon (Si), germanium (Ge), silicon germanium (SiGe), molybdenum disulfide (MoS2), tungsten diselenide ($WSe_2$), or hafnium ditelluride ($HfTe_2$), wherein the fin structure comprises silicon (Si), germanium (Ge), silicon germanium (SiGe), molybdenum disulfide ($MoS_2$), tungsten diselenide ($WSe_2$), or hafnium ditelluride ($HfTe_2$).

5. The semiconductor device of claim 1, wherein the conductive feature extends through the second source/drain feature.

6. The semiconductor device as claimed in claim 5, wherein the conductive feature extends through the first source/drain feature.

7. The semiconductor device of claim 1,
   wherein the first transistor further comprises a first source/drain contact disposed over the first source/drain feature,
   wherein the second transistor further comprises a second source/drain contact disposed over the second source/drain feature,
   wherein the conductive feature is in direct contact with the first source/drain contact and the second source/drain contact.

8. The semiconductor device of claim 1,
   wherein the first transistor further comprises a third source/drain contact disposed below the first source/drain feature,
   wherein the second transistor further comprises a fourth source/drain contact disposed over the second source/drain feature,
   wherein the conductive feature is in direct contact with the third source/drain contact and the fourth source/drain contact.

9. A semiconductor device, comprising:
   a first transistor comprising:
      a first source feature and a first drain feature, and
      a plurality of channel members vertically stacked over one another and extending between the first source feature and the first drain feature;
   a second transistor disposed over the first transistor, the second transistor comprising:
      a second source feature and a second drain feature, and
      a fin structure extending between the second source feature and the second drain feature; and
   at least one passivation layer between the first transistor and the second transistor such that the at least one passivation layer extends continuously from between first source feature and the second source feature to between first drain feature and the second drain feature,
   wherein the second source feature is directly over the first source feature,
   wherein the second drain feature is directly over the first drain feature,
   wherein an entirety of the at least one passivation layer is disposed below the fin structure.

10. The semiconductor device of claim 9,
    wherein the first transistor further comprises a first drain contact disposed over the first drain feature,
    wherein the second transistor further comprises a second drain contact disposed over the second drain feature.

11. The semiconductor device of claim 10,
    wherein the first drain feature comprises silicon doped with an n-type dopant
    wherein the second drain feature comprises silicon germanium doped with a p-type dopant,
    wherein the first drain contact and the second drain contact comprise a metal.

12. The semiconductor device of claim 10,
    wherein the first drain contact overhangs the first drain feature, wherein the second drain contact overhangs the second drain feature.

13. The semiconductor device of claim 10, further comprising a first conductive feature electrically coupling the first drain contact and the second drain contact.

14. The semiconductor device of claim 13, wherein the first conductive feature extends through the second drain feature.

15. The semiconductor device of claim 10,
wherein the first transistor further comprises a first source contact disposed below the first drain feature,
wherein the second transistor further comprises a second source contact disposed over the second drain feature.

16. A semiconductor structure, comprising:
a backside dielectric layer;
a plurality of nanostructures disposed over the backside dielectric layer;
a first gate structure wrapping around each of the plurality of nanostructures;
a first source/drain feature and a second source/drain feature disposed over the backside dielectric layer and sandwiching the plurality of nanostructures along a direction;
a first source/drain contact extending through the backside dielectric layer to contact the first source/drain feature;
a first passivation layer extending continuously over the first gate structure, the first source/drain feature and the second source/drain feature;
a second passivation layer disposed over the first passivation layer;
a semiconductor fin disposed on the second passivation layer; and
a second gate structure wrapping over the semiconductor fin.

17. The semiconductor structure of claim 16, wherein the semiconductor fin is disposed directly over the plurality of nanostructures.

18. The semiconductor structure of claim 16, further comprising:
a third source/drain feature and a fourth source/drain feature sandwiching the semiconductor fin along a direction.

19. The semiconductor structure of claim 18, further comprising:
a second source/drain contact disposed over and in electrical communication with the second source/drain feature,
wherein the first passivation layer extends continuously over the first source/drain contact.

20. The semiconductor structure of claim 18, further comprising:
a third source/drain contact disposed over and in electrical communication with the third source/drain feature; and
a fourth source/drain contact disposed over and in electrical communication with the fourth source/drain feature.

* * * * *